United States Patent
Hirai et al.

(10) Patent No.: US 9,449,708 B2
(45) Date of Patent: Sep. 20, 2016

(54) NONVOLATILE SEMICONDUCTOR MEMORY DEVICE

(71) Applicant: KABUSHIKI KAISHA TOSHIBA, Minato-ku (JP)

(72) Inventors: Ryota Hirai, Kawasaki (JP); Yasuhiro Shiino, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/138,314

(22) Filed: Dec. 23, 2013

(65) Prior Publication Data

US 2015/0070986 A1  Mar. 12, 2015

(30) Foreign Application Priority Data

Sep. 9, 2013 (JP) ................... 2013-186714

(51) Int. Cl.
G11C 16/10 (2006.01)
G11C 16/34 (2006.01)
G11C 16/04 (2006.01)

(52) U.S. Cl.
CPC ....... G11C 16/3459 (2013.01); G11C 16/0483 (2013.01); G11C 16/3427 (2013.01)

(58) Field of Classification Search
CPC .................................................... G11C 16/10
USPC .................................................... 365/185.17
See application file for complete search history.

(56) References Cited

U.S. PATENT DOCUMENTS

| | | | |
|---|---|---|---|
| 7,009,881 B2 | 3/2006 | Noguchi | |
| 7,411,819 B2 | 8/2008 | Takeuchi | |
| 7,508,713 B2 | 3/2009 | Sekar et al. | |
| 7,916,547 B2 | 3/2011 | Hosono | |
| 8,315,104 B2 | 11/2012 | Futatsuyama et al. | |
| 8,363,480 B2 | 1/2013 | Hazama | |
| 8,811,077 B2 | 8/2014 | Hung et al. | |
| 2005/0254302 A1* | 11/2005 | Noguchi | 365/185.17 |
| 2009/0034329 A1* | 2/2009 | Shibata | 365/185.03 |
| 2010/0091566 A1* | 4/2010 | Sato et al. | 365/185.03 |
| 2012/0213004 A1* | 8/2012 | Yun et al. | 365/185.11 |

FOREIGN PATENT DOCUMENTS

| | | |
|---|---|---|
| JP | 2000-285692 | 10/2000 |
| JP | 2005-327409 | 11/2005 |
| JP | 2007-87526 | 4/2007 |
| JP | 2009-70501 | 4/2009 |
| JP | 2010-9733 | 1/2010 |
| JP | 2010-522951 | 7/2010 |
| JP | 2012-150876 | 8/2012 |
| JP | 5159477 | 3/2013 |

OTHER PUBLICATIONS

Office Action issued in Japanese Application No. 2013-186714, dated Jan. 12, 2016. (with English translation).

\* cited by examiner

*Primary Examiner* — Min Huang
(74) *Attorney, Agent, or Firm* — Oblon, McClelland, Maier & Neustadt, L.L.P.

(57) ABSTRACT

A nonvolatile semiconductor memory device according to an embodiment includes: a memory cell array configured having NAND strings arranged therein; a plurality of word lines; a plurality of bit lines; a source line; and a control circuit configured to apply a verify voltage to a selected word line, apply a read pass voltage that renders conductive an unselected memory cell regardless of cell data to an unselected word line, and apply a bit line voltage of a certain value to a selected bit line, thereby executing a write verify operation that determines whether a selected memory cell has a desired threshold voltage or not. The control circuit is configured capable of changing a voltage value of the bit line voltage based on a position of the selected word line among the plurality of word lines relative to the NAND string.

20 Claims, 18 Drawing Sheets

A: Binary Data Storage

B: 4-Level Data Storage

Threshold Voltage Distribution After Write Verify

Threshold Voltage Distribution After Write Verify

Threshold Voltage Distribution After Write Verify

NONVOLATILE SEMICONDUCTOR MEMORY DEVICE

CROSS REFERENCE TO RELATED APPLICATION

This application is based upon and claims the benefit of priority from Japanese Patent Application No. 2013-186714, filed on Sep. 9, 2013, the entire contents of which are incorporated herein by reference.

BACKGROUND

1. Field

Embodiments relate to a nonvolatile semiconductor memory device.

2. Description of the Related Art

A NAND type flash memory is known as a nonvolatile semiconductor memory device that is electrically rewritable and capable of a high degree of integration. A memory cell of the NAND type flash memory includes: a charge accumulation layer formed on a semiconductor substrate via a tunnel insulating film; and a control gate stacked on the charge accumulation layer via an inter-gate insulating film. The memory cell stores data in a nonvolatile manner by a charge accumulation state of the charge accumulation layer.

This NAND type flash memory, after performing a write operation to the memory cell, executes a write verify operation that verifies whether desired data has been written in the memory cell. When the write operation and the write verify operation are performed sequentially on a plurality of the memory cells, there is a risk that operation conditions change between the write verify operation on a first half of the memory cells and the write verify operation on a second half of the memory cells, whereby the write verify operation cannot be precisely executed.

DETAILED DESCRIPTION

A nonvolatile semiconductor memory device according to an embodiment comprises: a memory cell array configured having NAND strings arranged therein, each of the NAND strings including a memory string configured having a plurality of memory cells connected in series therein, and a first select transistor and second select transistor respectively connected to two ends of the memory string; a plurality of word lines respectively connected to control gate electrodes of the plurality of memory cells; a plurality of bit lines each connected to a first end of the memory string included in the NAND strings via the first select transistor; a source line connected to a second end of the memory string via the second select transistor; and a control circuit configured to apply a verify voltage to a selected word line, apply a read pass voltage that renders conductive an unselected memory cell regardless of cell data to an unselected word line, and apply a bit line voltage of a certain value to a selected bit line, thereby executing a write verify operation that determines whether a selected memory cell has a desired threshold voltage or not. The control circuit is configured capable of changing a voltage value of the bit line voltage based on a position of the selected word line among the plurality of word lines relative to the NAND string.

Next, a nonvolatile semiconductor memory device according to embodiments will be described with reference to the drawings.

First Embodiment

Figure 1:
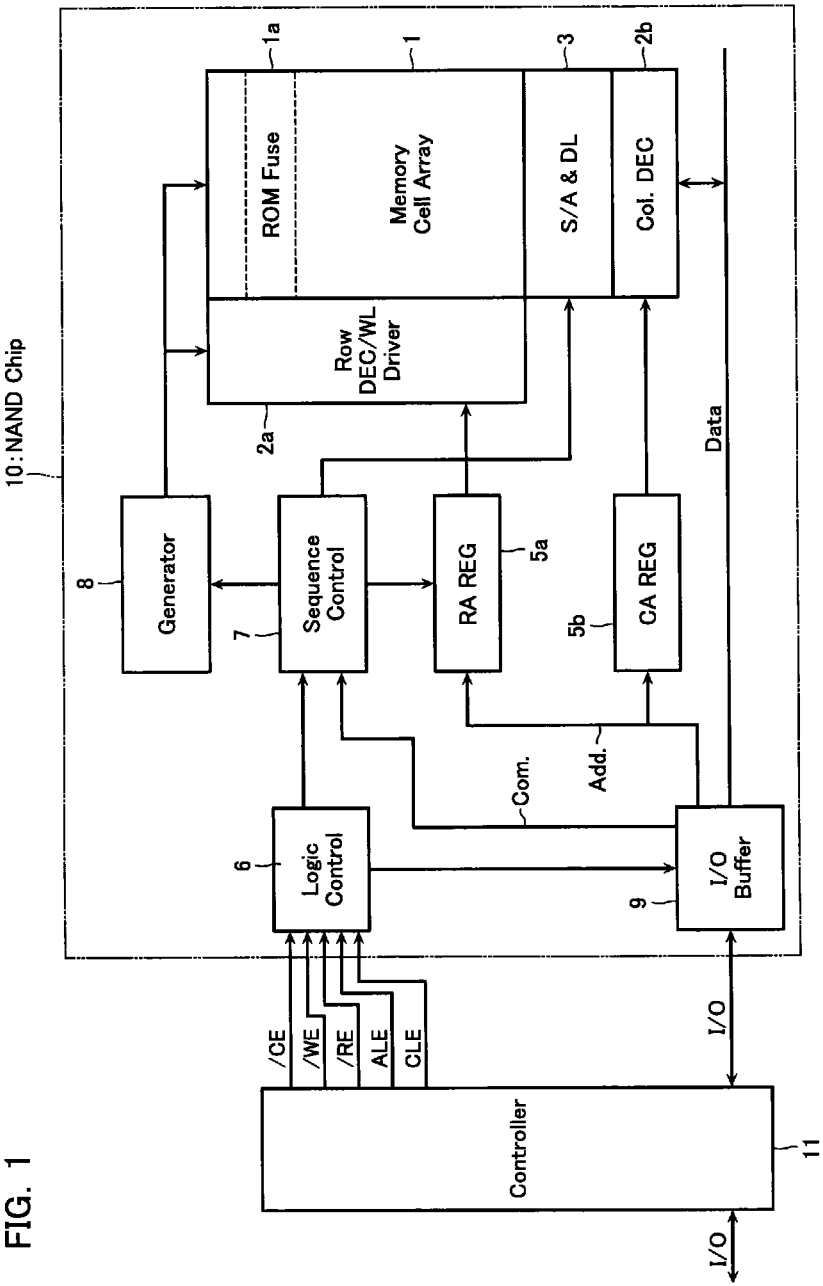
FIG. 1 is a block diagram of a nonvolatile semiconductor memory device according to a first embodiment.

First, an overall configuration of a nonvolatile semiconductor memory device according to a first embodiment will be described. FIG. 1 is a block diagram of the nonvolatile semiconductor memory device according to the present embodiment.

This NAND type flash memory comprises a NAND chip 10 and a controller 11. The controller 11 controls this NAND chip 10. A memory cell array 1 configuring the NAND chip 10 is configured having a plurality of floating gate type memory cells disposed in a matrix therein. Each memory cell includes a charge accumulation layer formed on a semiconductor substrate via a tunnel insulating film, and a control gate stacked on the charge accumulation layer via an inter-gate insulating film. This memory cell array 1 may be provided with a user-inaccessible ROM fuse region 1a, as required. This ROM fuse region 1a stores various kinds of information required in control of the device during data write, and so on.

Disposed in a periphery of the memory cell array 1 are a row decoder/word line driver 2a, a column decoder 2b, a sense amplifier/latch circuit 3, a logic control circuit 6, a sequence control circuit 7, and a voltage generating circuit 8. These row decoder/word line driver 2a, column decoder 2b, sense amplifier/latch circuit 3, logic control circuit 6, sequence control circuit 7, and voltage generating circuit 8 configure a control circuit and perform write or read of data in page units to/from the memory cell array 1.

The row decoder/word line driver 2a drives a word line and a select gate line of the memory cell array 1. The sense amplifier/latch circuit 3 comprises a 1-page portion of sense amplifier circuits and data holding circuits. A 1-page portion of read data of the sense amplifier/latch circuit 3 is sequentially column-selected by the column decoder 2b to be outputted to an external I/O terminal via an I/O buffer 9. Write data provided from the I/O terminal is selected by the column decoder 2b to be loaded into the sense amplifier/latch circuit 3. The sense amplifier/latch circuit 3 has a 1-page portion of write data loaded therein. A row address signal and a column address signal are inputted via the I/O buffer 9 to be respectively transferred to the row decoder 2a and the column decoder 2b. In an erase operation, a row address register 5a holds an erase block address, and in a write operation or a read operation, the row address register 5a holds a page address. A column address register 5b is inputted with a lead column address for write data load before start of a write operation, or a lead column address for a read operation. The column address register 5b holds the inputted column address until a write enable signal /WE or a read enable signal /RE is changed by a certain condition.

The logic control circuit 6 controls input of a command or an address, and input/output of data based on control signals such as a chip enable signal /CE, a command latch enable signal CLE, an address latch enable signal ALE, the write enable signal /WE, the read enable signal /RE, and so on. The read operation or write operation are executed by a command. On receiving the command, the sequence control circuit 7 performs sequence control of the read operation or of write or erase. The voltage generating circuit 8 is controlled by the sequence control circuit 7 to generate a certain voltage required in various operations.

The controller 11 executes control of write and read of data by conditions appropriate to a present write state of the NAND chip 10. Note that part of the later-described write operation may be configured to be performed by a NAND chip 10 side.

[Memory Cell Array]

Figure 2:
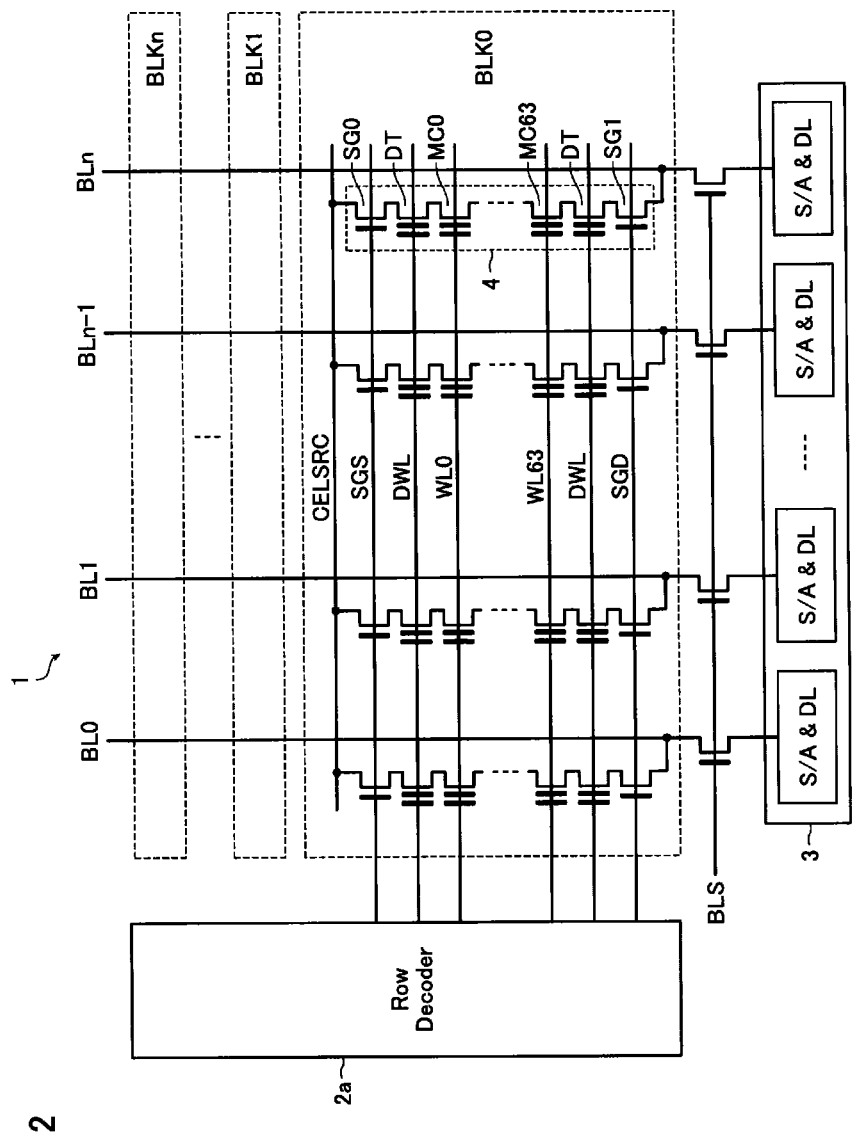
FIG. 2 is a circuit diagram showing a memory cell array and peripheral circuits in the nonvolatile semiconductor memory device according to the first embodiment.
Figure 3:
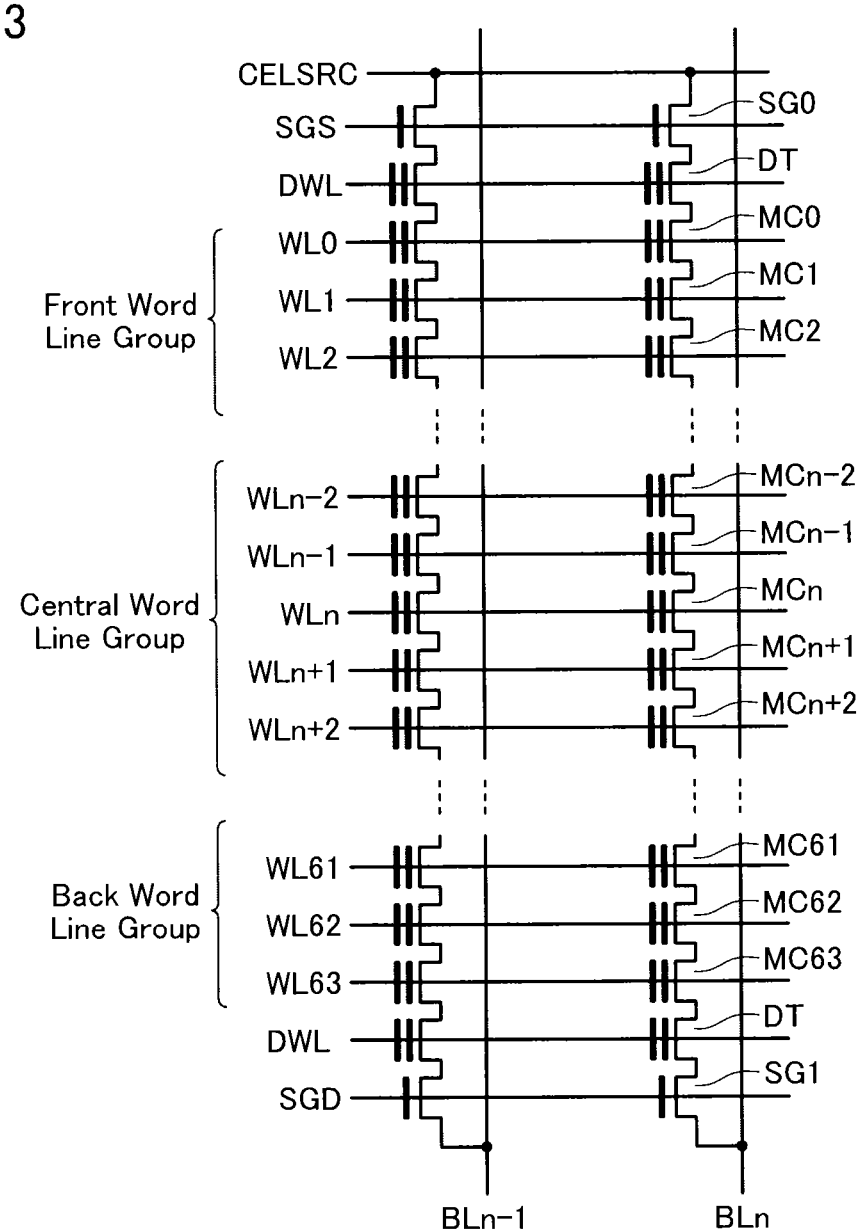
FIG. 3 is a circuit diagram showing the memory cell array in the nonvolatile semiconductor memory device according to the first embodiment.

Next, the memory cell array 1 and the sense amplifier/latch circuit 3 in the nonvolatile semiconductor memory device according to the present embodiment will be described. FIG. 2 is a circuit diagram showing the memory cell array 1 and peripheral circuits. FIG. 3 is a circuit diagram showing the memory cell array 1.

As shown in FIGS. 2 and 3, a NAND string 4 is configured by: a memory string comprising 64 series-connected memory cells MC0 to MC63; dummy transistors DT connected one to each of the two ends of the memory string; and select gate transistors SG0 and SG1 connected to the two ends of the memory string and dummy transistors DT. A source of the select gate transistor SG0 is connected to a common source line CELSRC, and a drain of the select gate transistor SG1 is connected to a bit line BL (BL0 to BLn). Control gate electrodes of the memory cells MC0 to MC63 are respectively connected to word lines WL (WL0 to WL63). A gate electrode of the dummy transistor DT is connected to a dummy word line DWL. Gate electrodes of the select gate transistors SG0 and SG1 are connected to select gate lines SGS and SGD. The number of dummy transistors DT connected to one end of the memory string is not limited to one, and it is possible to provide any number of dummy transistors DT.

A range of the plurality of memory cells MC along one word line WL configures a page which is a unit of batch read and write of data. In addition, a range of the plurality of NAND strings 4 aligned in a word line WL direction configures a block BLK which is a unit of batch erase of data. In FIG. 2, a plurality of blocks BLK0 to BLKn sharing the bit line BL are arranged in a bit line BL direction to configure the memory cell array 1. The word line WL, the dummy word line DWL, and the select gate lines SGS and SGD are driven by the row decoder 2a.

In the memory cell array 1 shown in FIG. 3, during a later-described write verify operation, the word lines WL are sometimes described as being divided into a plurality of ranges based on a position within the NAND string 4. In the example shown in FIG. 3, the word lines WL are divided into the following groupings, namely, a front word line group, a central word line group, and a back word line group. The front word line group is a grouping of the word lines WL close to the common source line CELSRC, and the back word line group is a grouping of the word lines WL close to the bit line BL. It is possible to arbitrarily set how many word lines are included in each of the front word line group, the central word line group, and the back word line group, or how many ranges the word lines WL are divided into.

[Data Storage States of Memory Cell]

Figure 4:
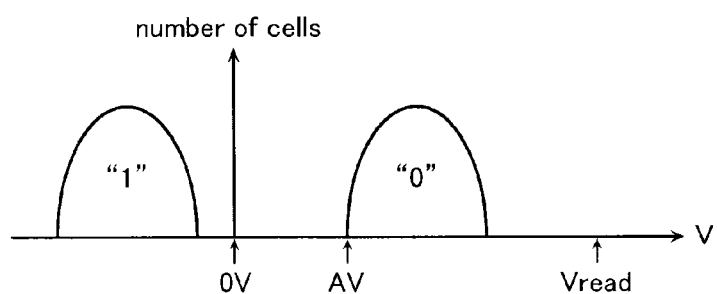
FIG. 4 is a view showing threshold voltage distributions of a memory cell in the nonvolatile semiconductor memory device according to the first embodiment.
Figure 4:
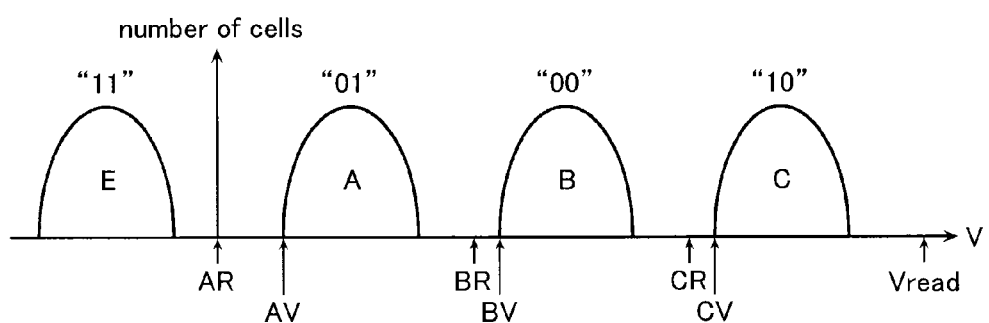

Next, data storage states of the memory cell in the NAND type flash memory according to the present embodiment will be described. FIG. 4 is a view showing threshold voltage distributions of the memory cell MC in the NAND type flash memory according to the present embodiment.

In the case where the memory cell MC in the NAND type flash memory stores binary data (1 bit/cell), threshold voltage distributions of data are as in A: Binary Data Storage in FIG. 4. A state where a threshold voltage is negative configures data "1" (erase state), and a state where a threshold voltage is positive configures data "0".

In the case where the memory cell MC in the NAND type flash memory stores 4-level data (2 bits/cell), threshold voltage distributions of data are as in B: 4-Level Data Storage in FIG. 4. In this case, from a lowest threshold voltage, four kinds of threshold voltage distributions (E, A, B, and C) are provided. Allocated to these threshold voltage distributions are four types of data, namely, "11", "01", "00", and "10". Now, the threshold voltage distribution E is a negative threshold voltage state obtained by batch block erase during the erase operation. In addition, voltages AR, BR, and CR between each of the threshold voltage distributions are determination voltages during the read operation. Voltages AV, BV, and CV at lower limits of each of the threshold voltage distributions are determination voltages during the write verify operation. Moreover, a voltage Vread is a voltage which is higher than an upper limit of the highest threshold voltage distribution C. This read pass voltage Vread is a voltage applied to an unselected word line WL during the read operation or the write verify operation.

[Write Operation and Erase Operation]

During the write operation of the nonvolatile semiconductor memory device, a selected memory cell MC in a selected NAND string 4 is applied with a certain write voltage from a selected word line WL. This write voltage causes a charge to shift from a body of the selected memory cell MC to the charge accumulation layer of the selected memory cell MC, whereby a threshold voltage required for rendering the selected memory cell MC conductive increases. During the erase operation of the nonvolatile semiconductor memory device, an erase voltage is applied to a body of the block BLK, whereby the memory cells MC of the block BLK are changed in a batch to the negative threshold voltage of the erase state.

[Write Verify Operation]

Next, a write verify operation in a comparative example and problems of the write verify operation in the comparative example will be described with reference to FIGS. 5A to 5D, and 6. It is assumed here that in the write operation, write is performed sequentially from the memory cell MC on a side of the common source line CELSRC in the NAND string 4. That is, the write operation is performed in order in the memory cells MC connected to the front word line group, the central word line group, and the back word line group, and the write verify operation that determines whether the threshold voltage has attained a desired value or not is performed on the memory cells MC that have undergone the write operation.

FIGS. 5A to 5D are views showing voltages, a cell current, threshold voltage distributions, and a threshold voltage during the write verify operation in the nonvolatile semiconductor memory device according to the comparative example. FIG. 6 is a schematic view explaining voltages applied during the write verify operation in the nonvolatile semiconductor memory device according to the comparative example.

The upper part of FIG. 6 shows a voltage application state when the write verify operation is executed on the memory cell MC1 connected to the word line WL1 included in the front word line group. The selected word line WL1 is applied with a verify voltage Vcgv. This verify voltage is for determining whether the selected memory cell MC1 has attained a desired threshold voltage distribution or not, and is set to any of the voltages AV, BV, and CV at lower limits of each of the threshold voltage distributions. Moreover, the unselected word line WL0 and the unselected word lines WL2 to WL63 are applied with the read pass voltage Vread that renders the unselected memory cell MC0 and the unselected memory cells MC2 to MC63 in a conductive state regardless of a state (data held by the cell) of the unselected memory cell MC0 and the unselected memory cells MC2 to MC63. The dummy word line DWL is applied with a dummy read voltage Vread_dmy that renders the dummy transistor DT in a conductive state. In addition, the select gate lines SGS and SGD are applied with a voltage Vsg that renders the select gate transistors SG0 and SG1 in a conductive state. Moreover, the bit line BL is applied with a bit line voltage Vbl. In this state, it is determined whether the selected memory cell MC1 is conductive and the bit line BL discharged, or not.

The lower part of FIG. 6 shows a voltage application state when the write verify operation is executed on the memory cell MC62 connected to the word line WL62 included in the back word line group. The selected word line WL62 is applied with the verify voltage Vcgv. Moreover, the unselected word lines WL0 to WL61 and the unselected word line WL63 are applied with the read pass voltage Vread that renders the unselected memory cells MC0 to MC61 and the unselected memory cell MC63 in a conductive state regardless of a state (data held by the cell) of the unselected memory cells MC0 to MC61 and the unselected memory cell MC63. The dummy word line DWL is applied with the dummy read voltage Vread_dmy that renders the dummy transistor DT in a conductive state. In addition, the select gate lines SGS and SGD are applied with the voltage Vsg that renders the select gate transistors SG0 and SG1 in a conductive state. Moreover, the bit line BL is applied with the bit line voltage Vbl. In this state, it is determined whether the selected memory cell MC62 is conductive and the bit line BL discharged, or not.

Figure 5A:
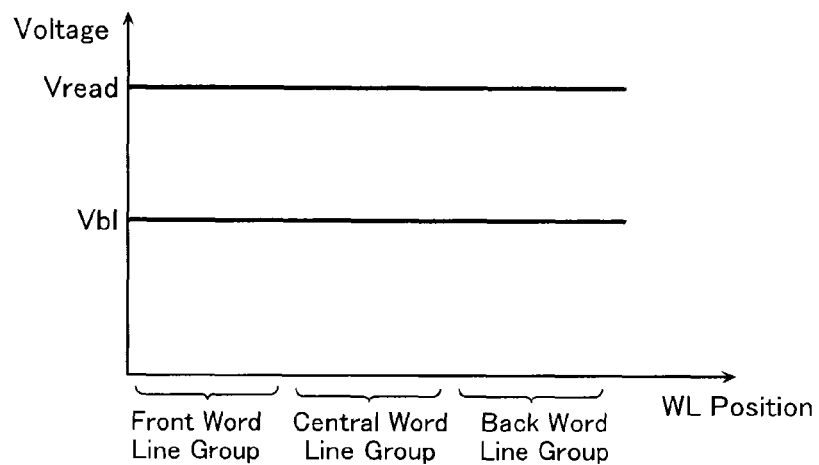
FIG. 5A is a view showing voltages during a write verify operation in a nonvolatile semiconductor memory device according to a comparative example.
Figure 6:
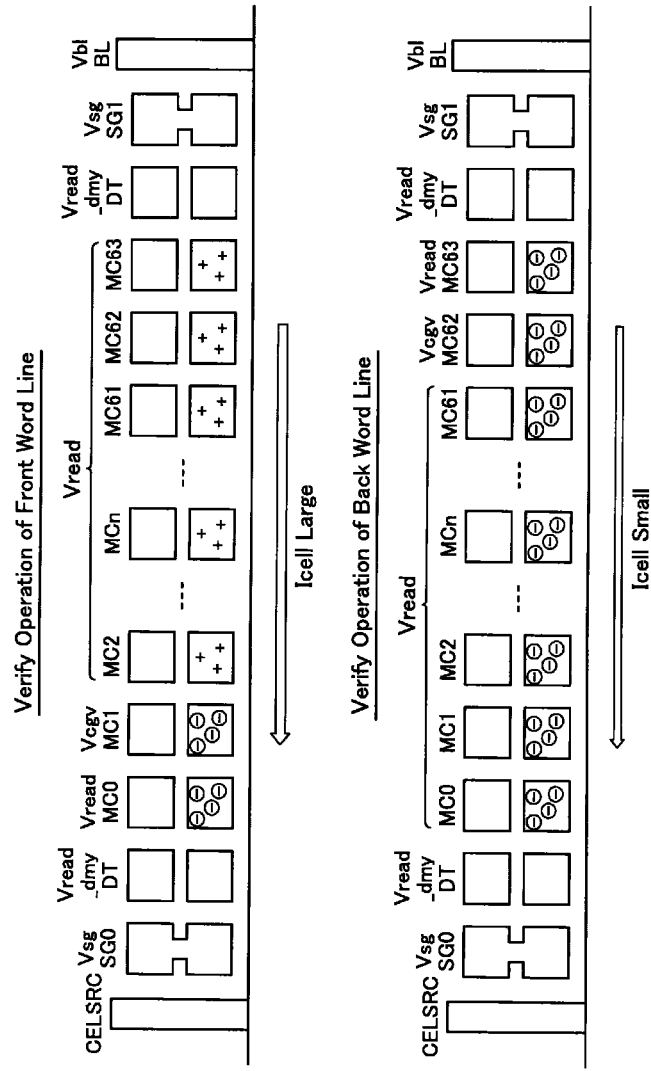
FIG. 6 is a schematic view explaining voltages applied during the write verify operation in the nonvolatile semiconductor memory device according to the comparative example.

Now, as shown in the voltage graph of FIG. 5A, in the write verify operation of the comparative example, a value of the read pass voltage applied to the unselected word lines WL and a value of the bit line voltage Vbl are held constant, whichever of the front word line group, the central word line group, and the back word line group the selected word line WL is positioned in.

As shown in FIG. 6, during the write verify operation of the front word line group, the unselected memory cells MC2 to MC63 have not undergone execution of the write operation and are thereby included in a negative threshold voltage distribution, hence are usually in an on state. In this case, it becomes easier for a current to flow in the NAND string 4, whereby a value of a cell current Icell flowing in the NAND string 4 increases.

On the other hand, during the write verify operation of the back word line group, the unselected memory cells MC0 to MC61 have already undergone execution of the write operation, hence there exist many of the unselected memory cells MC0 to MC61 that are included in a positive threshold voltage distribution. A memory cell MC included in a positive threshold voltage distribution is in a state of not conducting unless applied with a voltage of a certain value or more, hence it is difficult for a current to flow in the NAND string 4. As a result, the value of the cell current Icell flowing in the NAND string 4 is smaller compared to during the write verify operation of the front word line group.

Figure 5B:
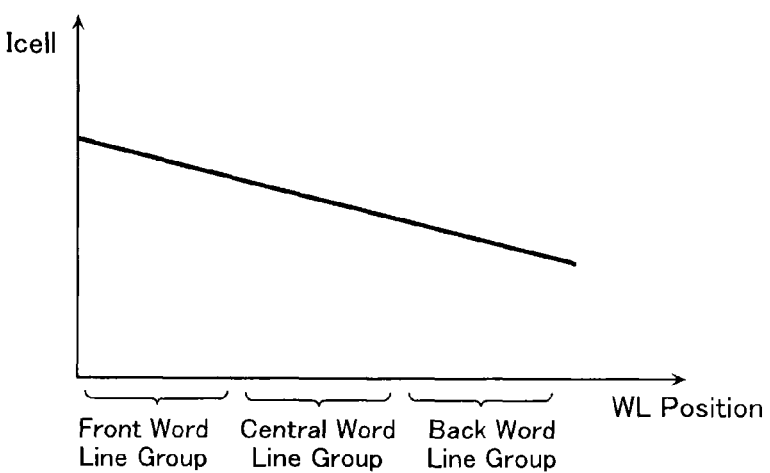
FIG. 5B is a view showing a cell current during the write verify operation in the nonvolatile semiconductor memory device according to the comparative example.
Figure 5C:
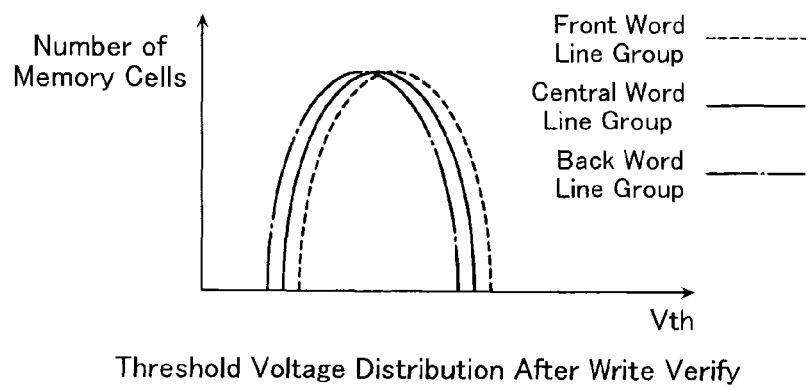
FIG. 5C is a view showing threshold voltage distributions during the write verify operation in the nonvolatile semiconductor memory device according to the comparative example.
Figure 5D:
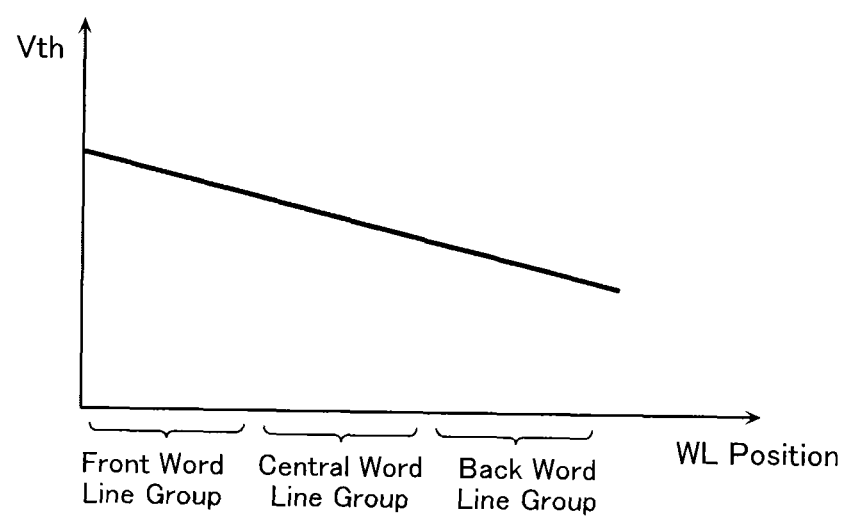
FIG. 5D is a view showing a threshold voltage during the write verify operation in the nonvolatile semiconductor memory device according to the comparative example.

Therefore, as shown in the graph of cell current Icell in FIG. 5B, as a position of the word line WL where the write verify operation is executed changes from the front word line group to the central word line group to the back word line group, the value of the cell current Icell gets smaller.

In the write verify operation of the memory cell MC connected to the word line WL included in the front word line group, the cell current Icell is large, hence the bit line BL is easily discharged and the write verify operation becomes difficult to pass. As shown in the graph of threshold voltage in FIG. 5D, the threshold voltage of the front word line group after write verify rises. As a result, the threshold voltage distribution of the memory cell MC after write verify pass is positioned at a higher threshold voltage (refer to illustration of threshold voltage distribution after write verify in FIG. 5C). On the other hand, in the write verify operation of the memory cell MC connected to the word line WL included in the back word line group, the cell current Icell is small and it is difficult for the bit line BL to be discharged, hence the write verify operation is easy to pass. As shown in the graph of threshold voltage in FIG. 5D, the threshold voltage of the back word line group after write verify lowers. As a result, the threshold voltage distribution of the memory cell MC after write verify pass is positioned at a lower threshold voltage (refer to illustration of threshold voltage distribution after write verify in FIG. 5C).

In the write verify operation of the comparative example where the value of the read pass voltage Vread and the value of the bit line voltage Vbl are set constant whichever of the front word line group, the central word line group, and the back word line group the selected word line WL is positioned in, there is a risk that the threshold voltage distribution after the write verify operation varies depending on a position of the word line WL.

In response to this problem, the nonvolatile semiconductor memory device according to the present embodiment executes a write verify operation of the kind described below. The write verify operation in the nonvolatile semiconductor memory device according to the present embodiment will be described below with reference to FIGS. 7A to 7D.

[Write Verify Operation According to First Embodiment]

FIGS. 7A to 7D are views showing voltages, a cell current, threshold voltage distributions, and a threshold voltage during the write verify operation in the nonvolatile semiconductor memory device according to the first embodiment. In the write verify operation in the nonvolatile semiconductor memory device according to the present embodiment, a voltage value of the bit line voltage is changed based on a position of the selected word line WL among the word lines WL (WL0 to WL 63) relative to the NAND string 4. This operation is executed by various kinds of control circuits in the above-described NAND chip based on a control signal of the controller 11.

Figure 7A:
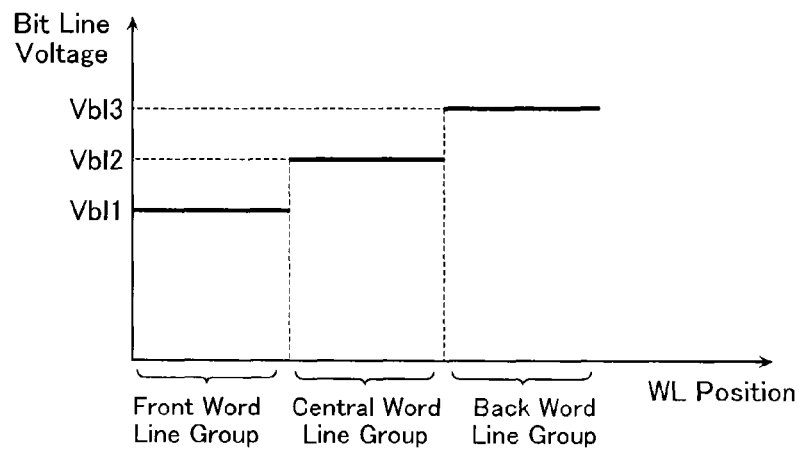
FIG. 7A is a view showing voltages during a write verify operation in the nonvolatile semiconductor memory device according to the first embodiment.
Figure 7B:
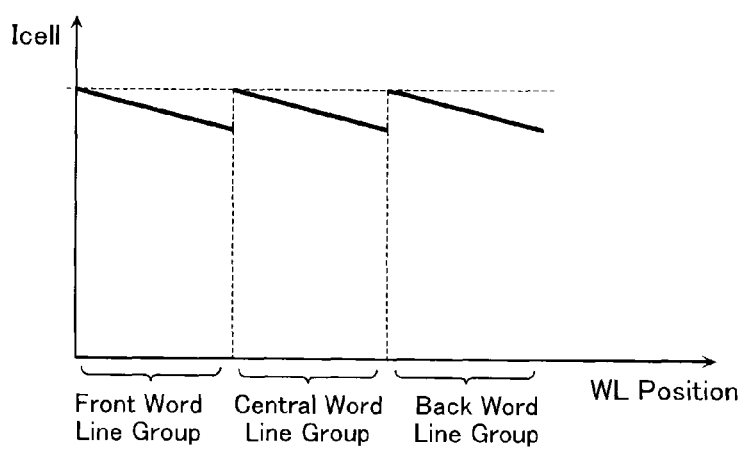
FIG. 7B is a view showing a cell current during the write verify operation in the nonvolatile semiconductor memory device according to the first embodiment.
Figure 7C:
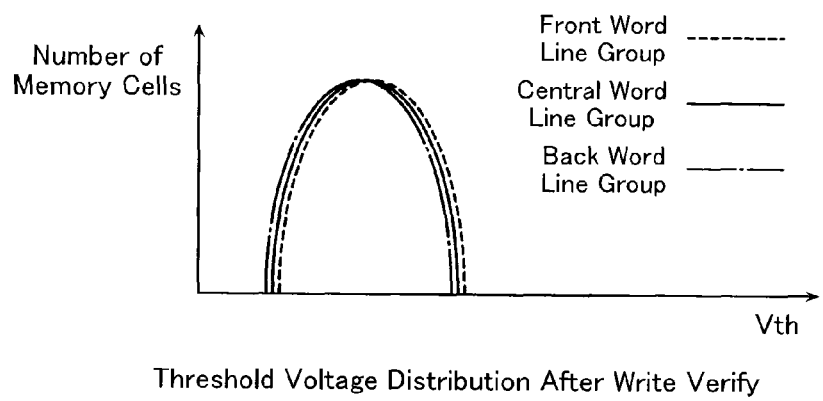
FIG. 7C is a view showing threshold voltage distributions during the write verify operation in the nonvolatile semiconductor memory device according to the first embodiment.
Figure 7D:
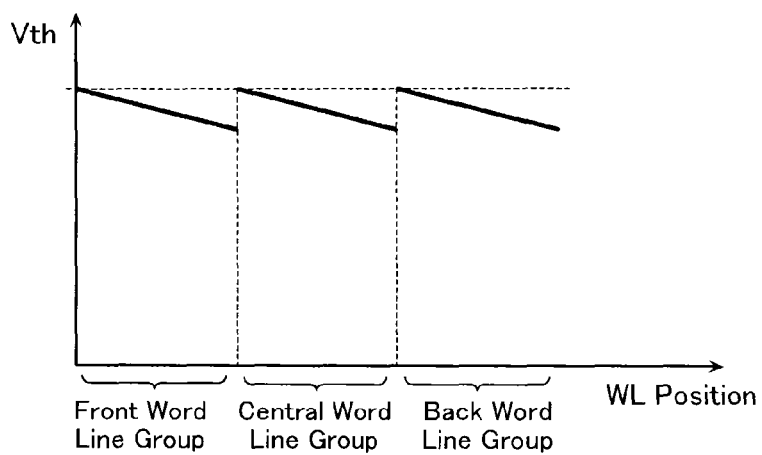
FIG. 7D is a view showing a threshold voltage during the write verify operation in the nonvolatile semiconductor memory device according to the first embodiment.

As shown in the voltage graph of FIG. 7A, in the write verify operation of the present embodiment, a value of the bit line voltage is changed to bit line voltages Vbl1, Vbl2, and Vbl3 based on which of the front word line group, the central word line group, and the back word line group the selected word line WL is positioned in. Note that when the selected word line WL is included in the front word line group, the value of the bit line voltage is fixed at the bit line voltage Vbl1. Similarly, when the selected word line WL is included in the central word line group, the value of the bit line voltage is fixed at the bit line voltage Vbl2, and when the selected word line WL is included in the back word line group, the value of the bit line voltage is fixed at the bit line voltage Vbl3.

In the present embodiment, settings of the verify voltage Vcgv, the read pass voltage Vread, the voltage Vsg applied to the select gate transistors SG0 and SG1, and so on, are similar to those in the write verify operation of the comparative example. This voltage application causes the write verify operation to the selected memory cell MC to be executed.

[Advantages]

Advantages of the write verify operation of the present embodiment will be described with reference to FIGS. 7A-7D. In the write verify operation of the present embodiment too, when the write verify operation of the memory cell MC connected to a final selected word line WL of the selected word lines WL included in the front word line group is executed, the cell current Icell lowers to a certain extent. However, when the write verify operation of the memory cell MC connected to the selected word line WL included in the central word line group is executed, the voltage applied to the bit line BL increases to the bit line voltage Vbl2. As a result, the cell current Icell flowing in the NAND string 4 also increases, which compensates a reduction of the cell current Icell caused by an increase in the write-completed memory cells MC. When the write verify operation of the memory cell MC connected to the selected word line WL included in the back word line group is executed too, the voltage applied to the bit line BL increases to the bit line voltage Vbl3, thereby compensating a reduction of the cell current Icell caused by an increase in the write-completed memory cells MC. The write verify operation of the present embodiment enables fluctuation in the cell current Icell flowing in the NAND string 4 during the write verify operation to be suppressed.

As a result, variation in the threshold voltage distribution after write verify caused by fluctuation in the cell current Icell can be reduced. Concretely, as shown in the graph of threshold voltage in FIG. 7D, variation in the threshold voltage after write verify between the front word line group and the back word line group is reduced. As shown in the illustration of threshold voltage distribution after write verify in FIG. 7C, the write verify operation of the present embodiment enables variation in the threshold voltage distribution after the operation has finished to be reduced more compared to in the write verify operation of the comparative example. The operation of the present embodiment enables a more precise write verify operation to be executed.

Second Embodiment

Next, a second embodiment of the present invention will be described with reference to FIGS. 8A to 8D. An overall configuration of a nonvolatile semiconductor memory device of the second embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from that of the first embodiment in changing a voltage value of the read pass voltage based on the position of the selected word line WL within the NAND string 4. The write verify operation in the nonvolatile semiconductor memory device according to the present embodiment will be described below with reference to FIGS. 8A to 8D.

[Write Verify Operation According to Second Embodiment]

FIGS. 8A to 8D are views showing voltages, a cell current, threshold voltage distributions, and a threshold voltage during the write verify operation in the nonvolatile semiconductor memory device according to the second embodiment. In the write verify operation in the nonvolatile semiconductor memory device according to the present embodiment, the voltage value of the read pass voltage is changed based on the position of the selected word line WL among the word lines WL (WL0 to WL 63) relative to the NAND string 4. This operation is executed by various kinds of control circuits in the above-described NAND chip based on a control signal of the controller 11.

Figure 8A:
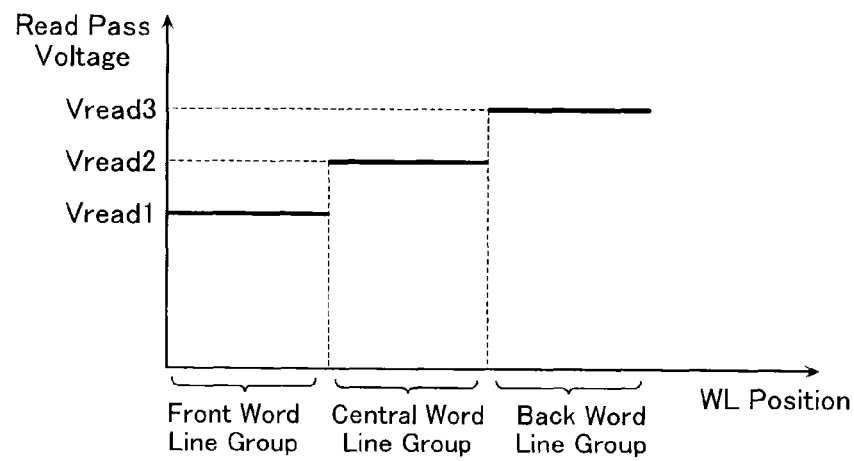
FIG. 8A is a view showing voltages during a write verify operation in a nonvolatile semiconductor memory device according to a second embodiment.
Figure 8B:
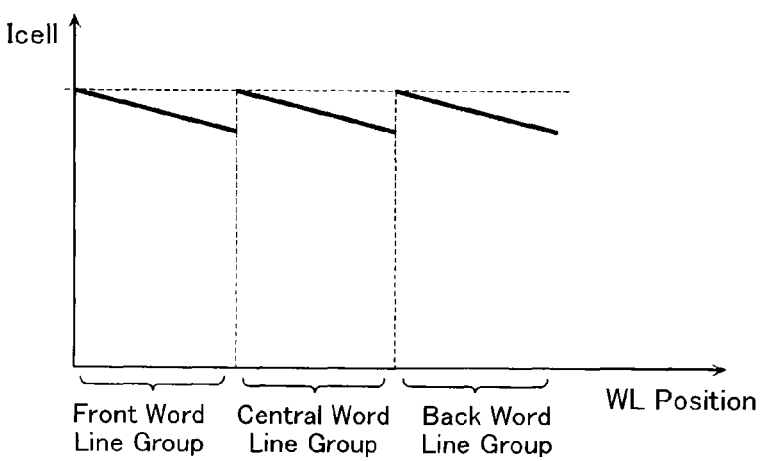
FIG. 8B is a view showing a cell current during the write verify operation in the nonvolatile semiconductor memory device according to the second embodiment.
Figure 8C:
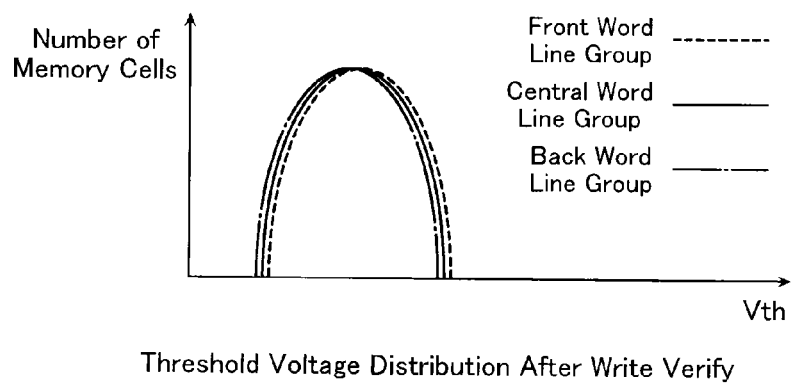
FIG. 8C is a view showing threshold voltage distributions during the write verify operation in the nonvolatile semiconductor memory device according to the second embodiment.
Figure 8D:
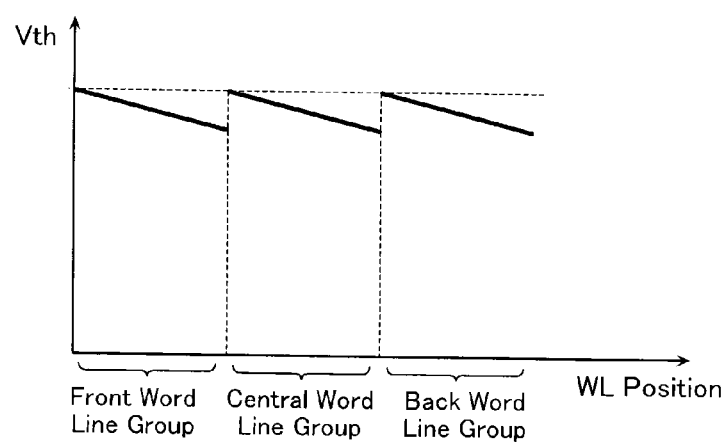
FIG. 8D is a view showing a threshold voltage during the write verify operation in the nonvolatile semiconductor memory device according to the first embodiment.

As shown in the voltage graph of FIG. 8A, in the write verify operation of the present embodiment, a value of the read pass voltage is changed to read pass voltages Vread1, Vread2, and Vread3 based on which of the front word line group, the central word line group, and the back word line group the selected word line WL is positioned in. Note that when the selected word line WL is included in the front word line group, the value of the read pass voltage is fixed at the read pass voltage Vread1. Similarly, when the selected word line WL is included in the central word line group, the value of the read pass voltage is fixed at the read pass voltage Vread2, and when the selected word line WL is included in the back word line group, the value of the read pass voltage is fixed at the read pass voltage Vread3.

In the present embodiment, settings of the bit line voltage Vbl, the verify voltage Vcgv, the voltage Vsg applied to the select gate transistors SG0 and SG1, and so on, are similar to those in the write verify operation of the comparative example. This voltage application causes the write verify operation to the selected memory cell MC to be executed.

[Advantages]

Advantages of the write verify operation of the present embodiment will be described with reference to FIGS. 8A to 8D. In the write verify operation of the present embodiment too, when the write verify operation of the memory cell MC connected to a final selected word line WL of the selected word lines WL included in the front word line group is executed, the cell current Icell lowers to a certain extent. However, when the write verify operation of the memory cell MC connected to the selected word line WL included in the central word line group is executed, the voltage applied to the unselected word line WL increases to the read pass voltage Vread2. As a result, the unselected memory cell MC becomes more easily conductive, and the cell current Icell flowing in the NAND string 4 increases, which compensates a reduction of the cell current Icell caused by an increase in the write-completed memory cells MC. When the write verify operation of the memory cell MC connected to the selected word line WL included in the back word line group is executed too, the voltage applied to the unselected word line WL increases to the read pass voltage Vread3, thereby compensating a reduction of the cell current Icell caused by an increase in the write-completed memory cells MC. The write verify operation of the present embodiment enables fluctuation in the cell current Icell flowing in the NAND string 4 during the write verify operation to be suppressed.

As a result, variation in the threshold voltage distribution after write verify caused by fluctuation in the cell current Icell can be reduced. Concretely, as shown in the graph of threshold voltage in FIG. 8D, variation in the threshold voltage after write verify between the front word line group and the back word line group is reduced. As shown in the illustration of threshold voltage distribution after write verify in FIG. 8C, the write verify operation of the present embodiment enables variation in the threshold voltage distribution after the operation has finished to be reduced more compared to in the write verify operation of the comparative example. The operation of the present embodiment enables a more precise write verify operation to be executed.

Third Embodiment

Next, a third embodiment of the present invention will be described with reference to FIG. 9. An overall configuration of a nonvolatile semiconductor memory device of the third embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The present embodiment differs from the above-described embodiments in that in the present embodiment, a position of the selected word line, a change value of the voltage, and the number of times of changes of the voltage when changing the voltage value of the bit line voltage or the read pass voltage, can be freely set. The write verify operation in the nonvolatile semiconductor memory device according to the present embodiment will be described below with reference to FIG. 9.

[Write Verify Operation According to Third Embodiment]

Figure 9:
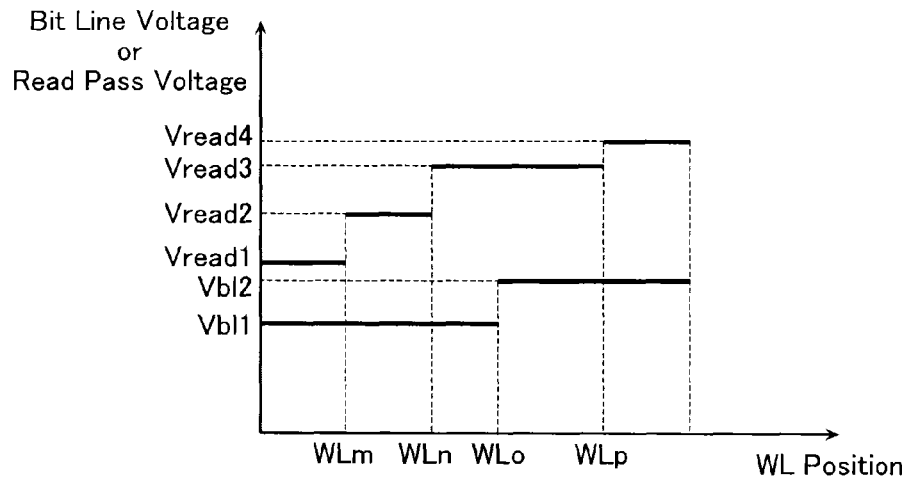
FIG. 9 is a view showing voltages during a write verify operation in a nonvolatile semiconductor memory device according to a third embodiment.

FIG. 9 is a view showing voltages during the write verify operation in the nonvolatile semiconductor memory device according to the third embodiment. In the write verify operation in the nonvolatile semiconductor memory device according to the present embodiment, the voltage values of the bit line voltage and the read pass voltage are changed based on the position of the selected word line WL within the NAND string 4. The voltage value of either one of the bit line voltage and the read pass voltage may be changed, or the voltage values of both may be changed.

As shown in the graph of FIG. 9, in the write verify operation of the present embodiment, when a position of the selected word line WL has reached positions of the word lines WLm, WLn, and WLp, a value of the read pass voltage is changed to read pass voltages Vread2, Vread3, and Vread4. Moreover, when a position of the selected word line WL has reached a position of the word line WLo, a value of the bit line voltage is changed to a bit line voltage Vbl2. At this time, it is possible to arbitrarily select which word line WL is to be reached for the value of the bit line voltage and the read pass voltage to be changed, in view of operation conditions. Moreover, it is also possible to arbitrarily select the number of times of changes in the value of the bit line voltage and the read pass voltage or how much the voltage value is changed. In the present embodiment, settings of the verify voltage Vcgv, the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage and the read pass voltage. The write verify operation of the present embodiment allows change conditions of the bit line voltage and the read pass voltage to be freely set, and fluctuation in the cell current Icell flowing in the NAND string 4 during the write verify operation to be reliably suppressed. As a result, variation in the threshold voltage distribution after write verify caused by fluctuation in the cell current Icell can be reduced. The operation of the present embodiment enables a more precise write verify operation to be executed.

Fourth Embodiment

Next, a fourth embodiment of the present invention will be described with reference to FIGS. 10A and 10B. An overall configuration of a nonvolatile semiconductor memory device of the fourth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. In the present embodiment, a position of the selected word line and the number of times of changes of the voltage when changing the voltage value of the bit line voltage or the read pass voltage differ from those in the above-described embodiments. The write verify operation in the nonvolatile semiconductor memory device according to the present embodiment will be described below with reference to FIGS. 10A and 10B.

[Write Verify Operation According to Fourth Embodiment]

Figure 10A:
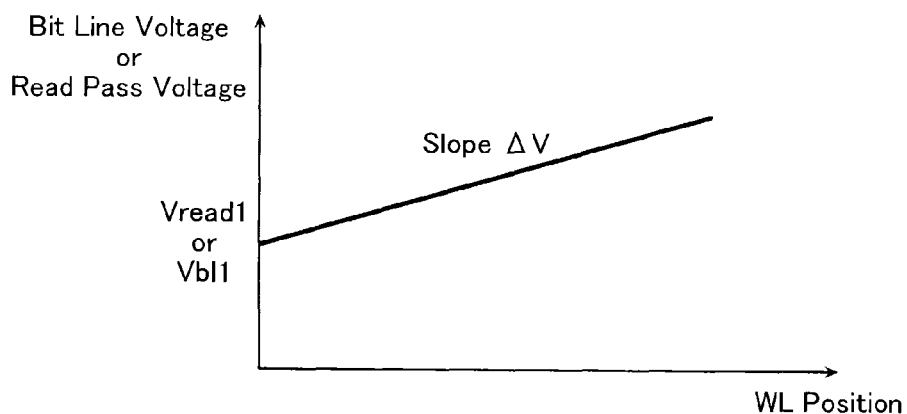
FIG. 10A is a view showing voltages during a write verify operation in a nonvolatile semiconductor memory device according to a fourth embodiment.
Figure 10B:
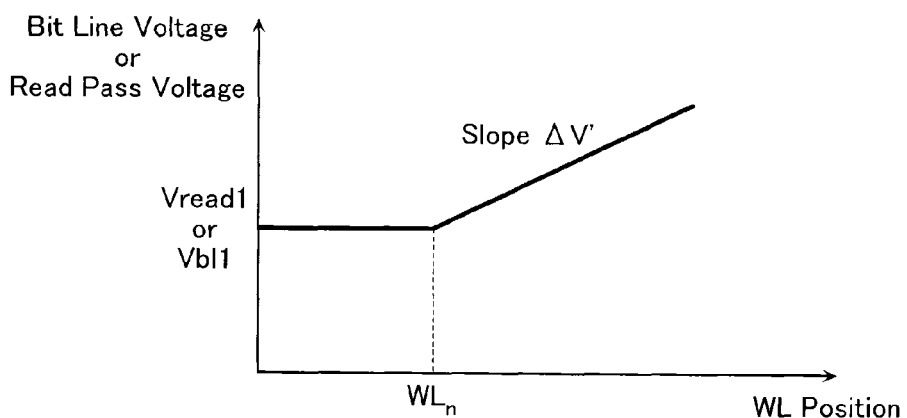
FIG. 10B is a view showing voltages during the write verify operation in the nonvolatile semiconductor memory device according to the fourth embodiment.

FIGS. 10A and 10B are views showing voltages during the write verify operation in the nonvolatile semiconductor memory device according to the fourth embodiment. In the write verify operation in the nonvolatile semiconductor memory device according to the present embodiment, the voltage values of the bit line voltage and the read pass voltage are changed based on the position of the selected word line WL within the NAND string 4. The voltage value of either one of the bit line voltage and the read pass voltage may be changed, or the voltage values of both may be changed. Note that in FIGS. 10A and 10B, the voltage values of the bit line voltage and the read pass voltage are displayed as one. This is not indicating that the bit line voltage and the read pass voltage are an identical voltage, but expresses the fact that an operation of the embodiment described below is applicable to both the bit line voltage and the read pass voltage. A similar method of depiction is also sometimes employed in the drawings of later embodiments.

As shown in the graph of FIG. 10A, in the write verify operation of the present embodiment, a value of the bit line voltage or the read pass voltage is changed respectively every selected word line WL. It is also possible to change the value of the bit line voltage or the read pass voltage for all of the selected word lines in this way. Moreover, at that time, a value of a slope ΔV indicating a rate that the value of the bit line voltage or the read pass voltage increases is also arbitrarily changeable. In addition, as shown in the graph of FIG. 10B, the following is also possible, namely that: when a position of the selected word line WL is included in a range which is closer to the common source line CELSRC than a certain position (word line WLn), the value of the bit line voltage or the read pass voltage is fixed at a bit line voltage Vbl1 and a read pass voltage Vread1; and, when a position of the selected word line WL is included in a range which is closer to the bit line BL than the certain position (word line WLn), the value of the bit line voltage or the read pass voltage is changed respectively every selected word line WL. Moreover, at that time, a value of a slope ΔV' indicating a rate that the value of the bit line voltage or the read pass voltage increases is also arbitrarily changeable.

In the present embodiment, settings of the verify voltage Vcgv, the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage and the read pass voltage. The write verify operation of the present embodiment allows change conditions of the bit line voltage and the read pass voltage to be freely set, and fluctuation in the cell current Icell flowing in the NAND string 4 during the write verify operation to be reliably suppressed. As a result, variation in the threshold voltage distribution after write verify caused by fluctuation in the cell current Icell can be reduced. The operation of the present embodiment enables a more precise write verify operation to be executed.

Fifth Embodiment

Next, a fifth embodiment of the present invention will be described with reference to FIGS. 11A to 11C. An overall configuration of a nonvolatile semiconductor memory device of the fifth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from those of the above-described embodiments in changing a voltage value of the verify voltage, as well as voltage values of the bit line voltage and the read pass voltage, based on the position of the selected word line WL among the word lines WL (WL0 to WL 63) relative to the NAND string 4. The write verify operation in the nonvolatile semiconductor memory device according to the present embodiment will be described below with reference to FIGS. 11A to 11C.

[Write Verify Operation According to Fifth Embodiment]

Figure 11A:
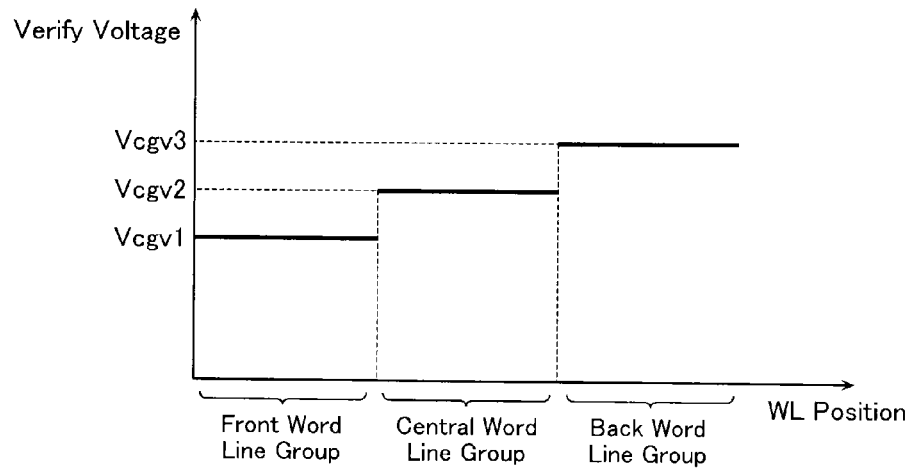
FIG. 11A is a view showing voltages during a write verify operation in a nonvolatile semiconductor memory device according to a fifth embodiment.
Figure 11B:
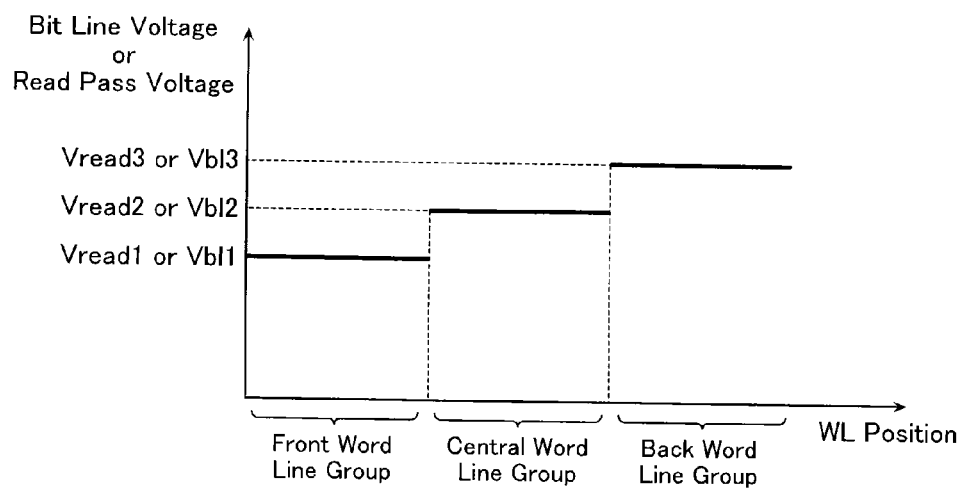
FIG. 11B is a view showing voltages during the write verify operation in the nonvolatile semiconductor memory device according to the fifth embodiment.
Figure 11C:
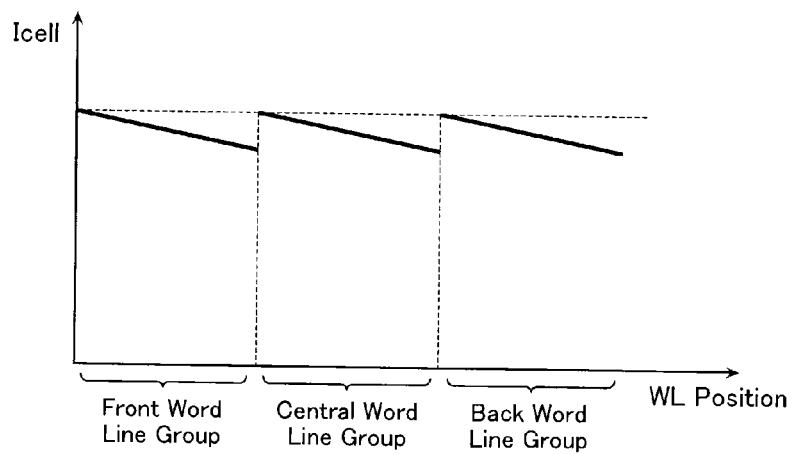
FIG. 11C is a view showing a cell current during the write verify operation in the nonvolatile semiconductor memory device according to the fifth embodiment.

FIGS. 11A to 11C are views showing voltages and a cell current during the write verify operation in the nonvolatile semiconductor memory device according to the fifth embodiment. As shown in the graph of bit line voltage and read pass voltage in FIG. 11B, in the write verify operation in the nonvolatile semiconductor memory device according to the present embodiment, a voltage value of at least one of the bit line voltage and the read pass voltage is changed based on the position of the selected word line WL within the NAND string 4.

In addition, as shown in the graph of verify voltage in FIG. 11A, in the write verify operation of the present embodiment, a value of the verify voltage is changed to verify voltages Vcgv1, Vcgv2, and Vcgv3 based on which of the front word line group, the central word line group, and the back word line group the selected word line WL is positioned in. Note that when the selected word line WL is included in the front word line group, the value of the verify voltage is fixed at the verify voltage Vcgv1. Similarly, when the selected word line WL is included in the central word line group, the value of the verify voltage is fixed at the verify voltage Vcgv2, and when the selected word line WL is included in the back word line group, the value of the verify voltage is fixed at the verify voltage Vcgv3.

In the present embodiment, settings of the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage and the read pass voltage. In addition, fluctuation in the cell current Icell can be suppressed also by changing the verify voltage. The write verify operation of the present embodiment allows change conditions of the bit line voltage, the read pass voltage, and the verify voltage to be freely set, and fluctuation in the cell current Icell flowing in the NAND string 4 during the write verify operation to be reliably suppressed (refer to the graph of cell current in FIG. 11C). As a result, variation in the threshold voltage distribution after write verify caused by fluctuation in the cell current Icell can be reduced. The operation of the present embodiment enables a more precise write verify operation to be executed.

Sixth Embodiment

Next, a sixth embodiment of the present invention will be described with reference to FIGS. 12A to 12D. An overall configuration of a nonvolatile semiconductor memory device of the sixth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from those of the above-described embodiments in that when the selected word line WL is included in a particular range, any one of the bit line voltage, the read pass voltage, and the verify voltage is set to a fixed value, and the remaining voltage values are configured to be variable. The write verify operation in the nonvolatile semiconductor memory device according to the present embodiment will be described below with reference to FIGS. 12A to 12D.

[Write Verify Operation According to Sixth Embodiment]

Figure 12A:
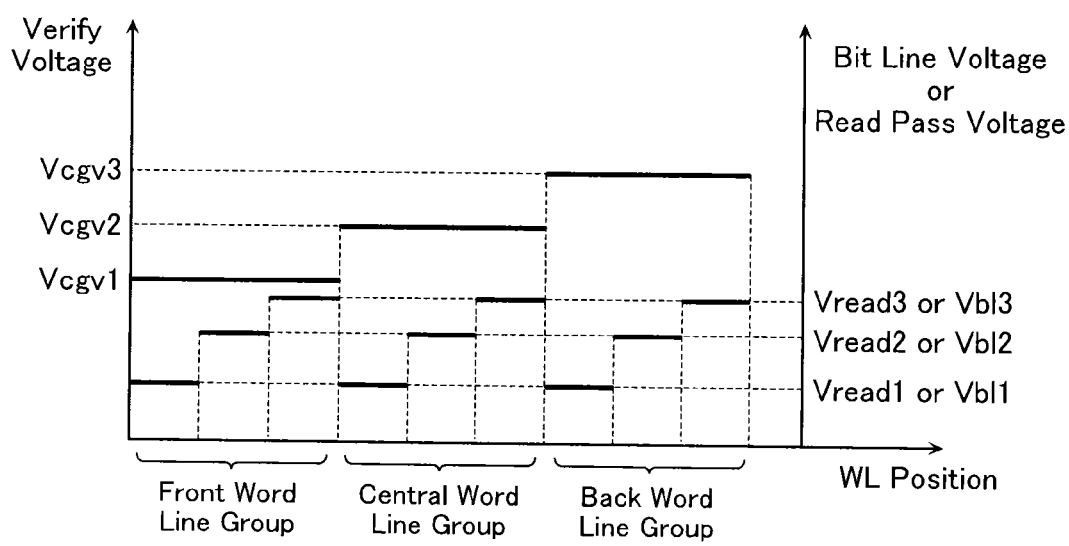
FIG. 12A is a view showing voltages during a write verify operation in a nonvolatile semiconductor memory device according to a sixth embodiment.
Figure 12B:
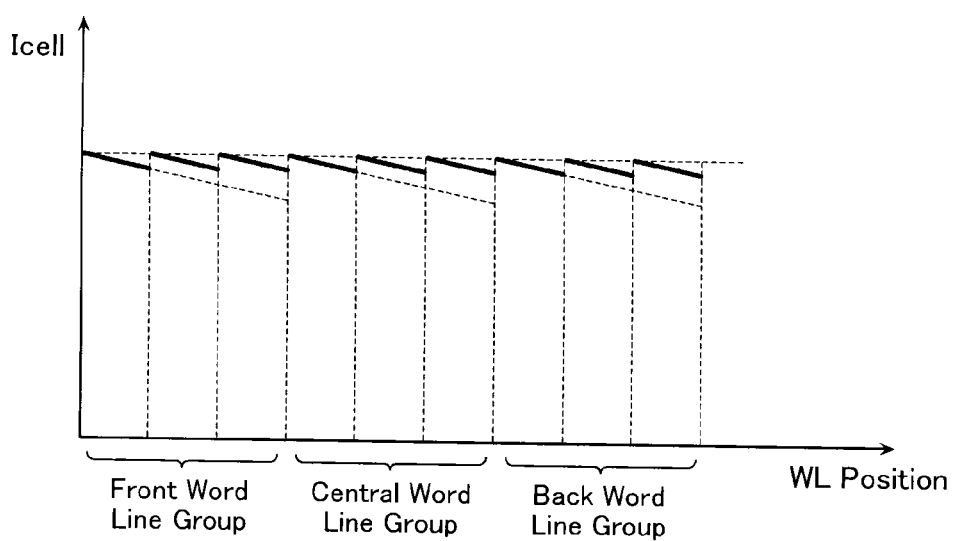
FIG. 12B is a view showing a cell current during the write verify operation in the nonvolatile semiconductor memory device according to the sixth embodiment.

FIGS. 12A and 12B are views showing voltages and a cell current during the write verify operation in the nonvolatile semiconductor memory device according to the sixth embodiment. As shown in the graph of voltages in FIG. 12A, in the write verify operation in the nonvolatile semiconductor memory device according to the present embodiment, a value of the verify voltage is changed to verify voltages Vcgv1, Vcgv2, and Vcgv3 based on which of the front word line group, the central word line group, and the back word line group the selected word line WL is positioned in. Note that when the selected word line WL is included in the front word line group, the value of the verify voltage is fixed at the verify voltage Vcgv1 Similarly, when the selected word line WL is included in the central word line group, the value of the verify voltage is fixed at the verify voltage Vcgv2, and when the selected word line WL is included in the back word line group, the value of the verify voltage is fixed at the verify voltage Vcgv3.

Additionally, as shown in the graph of voltages in FIG. 12A, in the write verify operation of the present embodiment, when a position of the selected word line WL is in the front word line group, at least any one of the bit line voltage and the read pass voltage is changed. For example, the value of the bit line voltage is changed to bit line voltages Vbl1, Vbl2, and Vbl3, and the value of the read pass voltage is changed to read pass voltages Vread1, Vread2, and Vread3. Similarly, when the position of the selected word line WL is in the central word line group or the back word line group too, at least any one of the bit line voltage and the read pass voltage is changed.

Figure 12C:
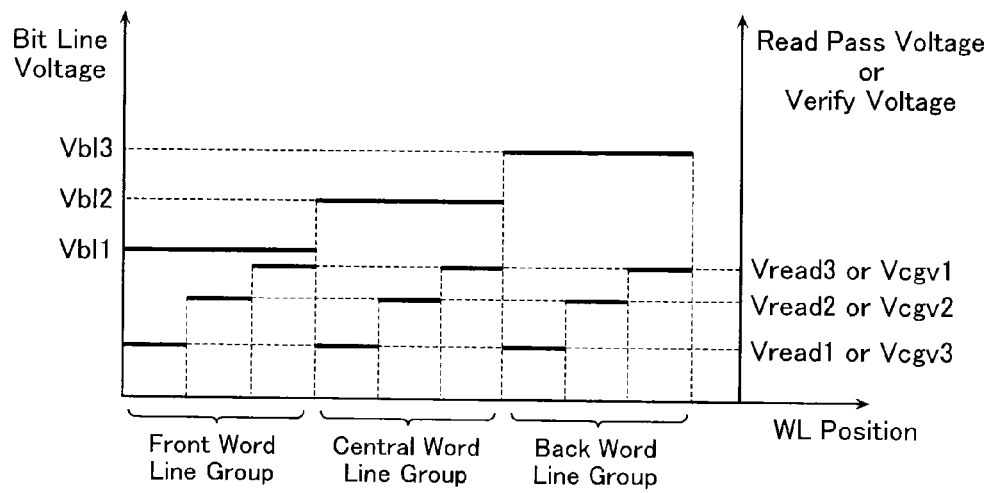
FIG. 12C is a view showing voltages during the write verify operation in the nonvolatile semiconductor memory device according to the sixth embodiment.
Figure 12D:
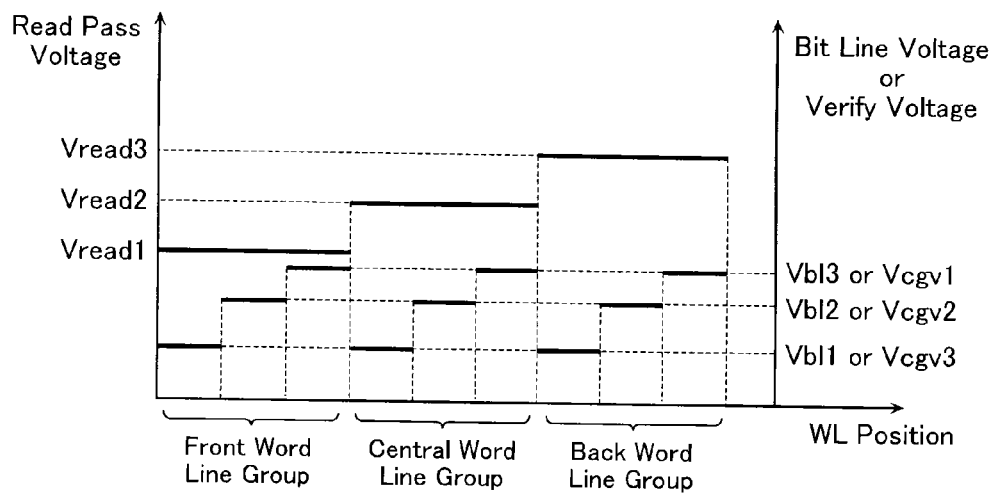
FIG. 12D is a view showing voltages during the write verify operation in the nonvolatile semiconductor memory device according to the sixth embodiment.

Moreover, as shown in the graphs of voltages in FIGS. 12C and 12D, in the write verify operation in the nonvolatile semiconductor memory device according to the present embodiment, a voltage fixed based on which of the front word line group, the central word line group, and the back word line group the selected word line WL is positioned in may be the bit line voltage, or may be the read pass voltage. In this case too, similarly to in the example described in FIG. 12A, the voltage values of the remaining voltages (bit line voltage, read pass voltage, verify voltage, and so on) can be changed.

In the present embodiment, settings of the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage, the read pass voltage, and the verify voltage. Combining an operation that fixes any one of the bit line voltage, the read pass voltage, and the verify voltage with an operation that changes the voltage values of the remaining voltages enables fluctuation in the cell current Icell flowing in the NAND string 4 during the write verify operation to be more reliably suppressed (refer to the graph of cell current in FIG. 12B). In this case, the cell current Icell is a state shown by the solid line, and has fluctuation reduced more than a state of the above-described embodiments shown by the dashed line. As a result, variation in the threshold voltage distribution after write verify caused by fluctuation in the cell current Icell can be reduced.

The operation of the present embodiment enables a more precise write verify operation to be executed.

Seventh Embodiment

Next, a seventh embodiment of the present invention will be described with reference to FIG. 13A. An overall configuration of a nonvolatile semiconductor memory device of the seventh embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from those of the above-described embodiments in setting the read pass voltage to different values for an unselected word line WL connected to the memory cell MC where the write operation has already finished and an unselected word line WL connected to the memory cell MC where the write operation has not yet been performed. The write verify operation in the nonvolatile semiconductor memory device according to the present embodiment will be described below with reference to FIG. 13A.

[Write Verify Operation According to Seventh Embodiment]

Figure 13A:
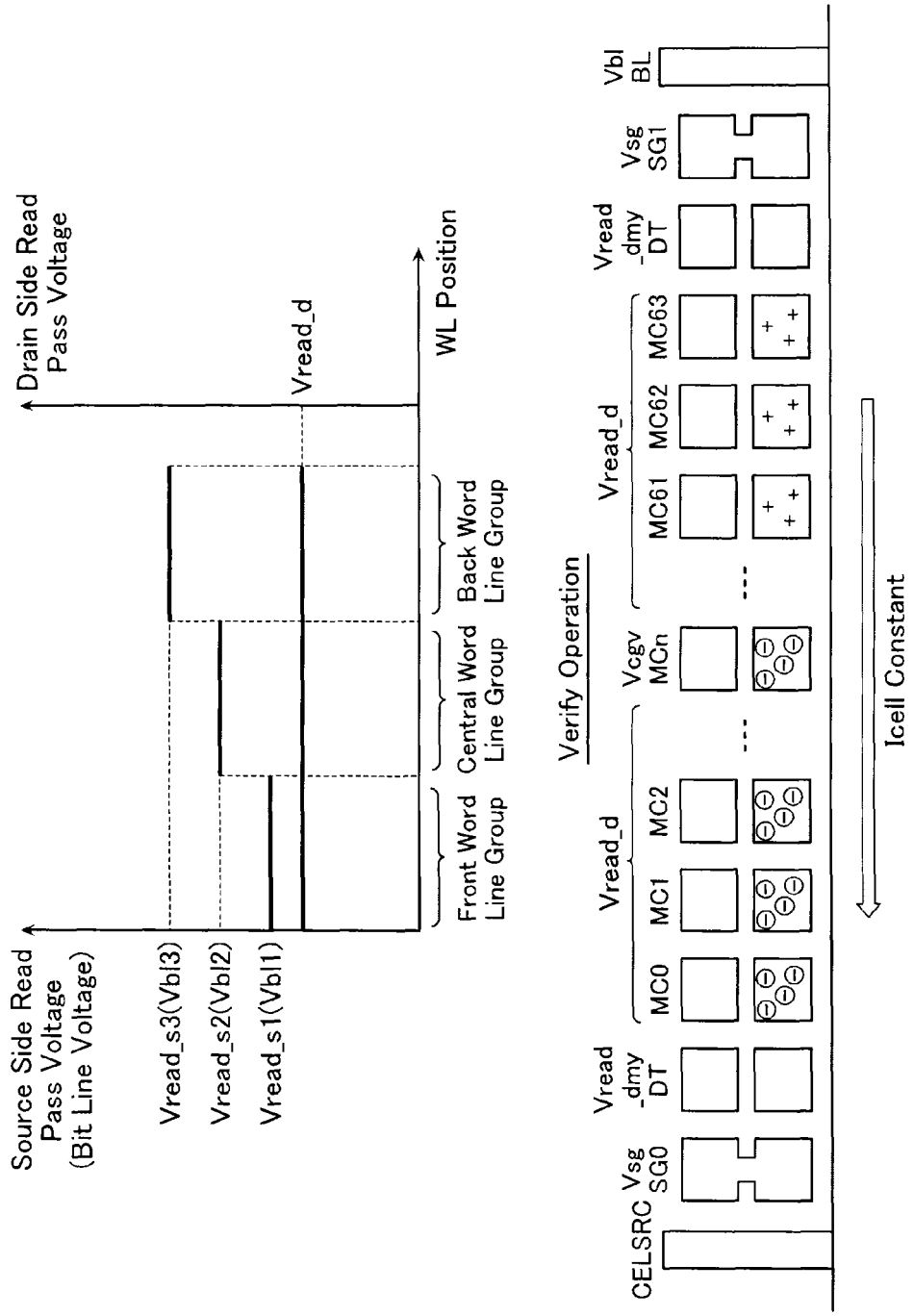
FIG. 13A is a view showing voltages during a write verify operation in a nonvolatile semiconductor memory device according to a seventh embodiment.

The lower part of FIG. 13A shows a voltage application state when the write verify operation is executed on a memory cell MCn. The selected word line WLn is applied with the verify voltage Vcgv. In addition, the unselected word lines WL0 to WLn−1 that are positioned more to a side of the common source line CELSRC than the selected word line WLn and are connected to the unselected memory cells MC0 to MCn−1 where the write operation has already finished are applied with a source side read pass voltage Vread_s that renders the unselected memory cells MC0 to MCn−1 in a conductive state regardless of a state of the unselected memory cells MC0 to MCn−1. Moreover, the unselected word lines WLn+1 to WL63 that are positioned more to a side of the bit line BL than the selected word line WLn and are connected to the unselected memory cells MCn+1 to MC63 where the write operation has not yet been performed are applied with a drain side read pass voltage Vread_d that renders the unselected memory cells MCn+1 to MC63 in a conductive state regardless of a state of the unselected memory cells MCn+1 to MC63.

As shown in the voltage graph in the upper part of FIG. 13A, in the write verify operation of the present embodiment, a value of the source side read pass voltage is changed to source side read pass voltages Vread_s1, Vread_s2, and Vread_s3 based on which of the front word line group, the central word line group, and the back word line group the selected word line WL is positioned in. Note that when the selected word line WL is included in the front word line group, the value of the source side read pass voltage is fixed at the source side read pass voltage Vread_s1. Similarly, when the selected word line WL is included in the central word line group, the value of the source side read pass voltage is fixed at the source side read pass voltage Vread_s2, and when the selected word line WL is included in the back word line group, the value of the source side read pass voltage is fixed at the source side read pass voltage Vread_s3.

In contrast, the drain side read pass voltage is fixed at the drain side read pass voltage Vread_d regardless of which of the front word line group, the central word line group, and the back word line group the selected word line WL is positioned in. At this time, the value of the bit line voltage may be changed to bit line voltages Vbl1, Vbl2, and Vbl3 based on which of the front word line group, the central word line group, and the back word line group the selected word line WL is positioned in.

In the present embodiment, settings of the verify voltage Vcgv, the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the read pass voltage. As a result, variation in the threshold voltage distribution after write verify caused by fluctuation in the cell current Icell can be reduced. Note that conditions for being conductive differ between the unselected memory cell MC where the write operation has already finished and the unselected memory cell MC where the write operation has not yet been performed. Therefore, respectively setting the read pass voltage applied to these memory cells to different values makes it possible to more finely control the write verify operation, thereby enabling a more precise write verify operation to be executed.

[Other Example 1 of Seventh Embodiment]

Figure 13B:
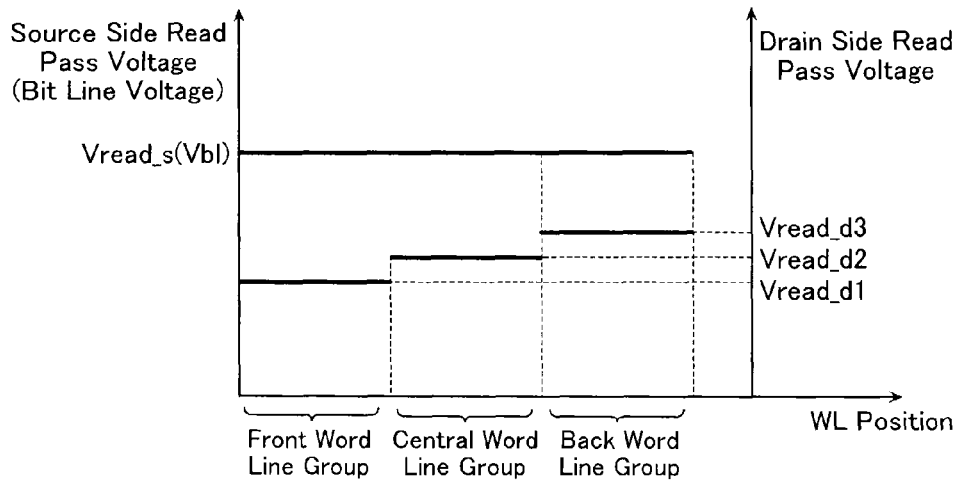
FIG. 13B is a view showing voltages during the write verify operation in the nonvolatile semiconductor memory device according to the seventh embodiment.

FIG. 13B is a view showing an operation in another example of the seventh embodiment. In the above-described embodiment, the drain side read pass voltage Vread_d was set to a fixed value. However, as shown in FIG. 13B, it is also possible to set the source side read pass voltage Vread_s to a fixed value and change the drain side read pass voltage to be drain side read pass voltages Vread_d1, Vread_d2, and Vread_d3. This too makes it possible to more finely control the write verify operation, thereby enabling a more precise write verify operation to be executed.

[Other Example 2 of Seventh Embodiment]

Figure 14:
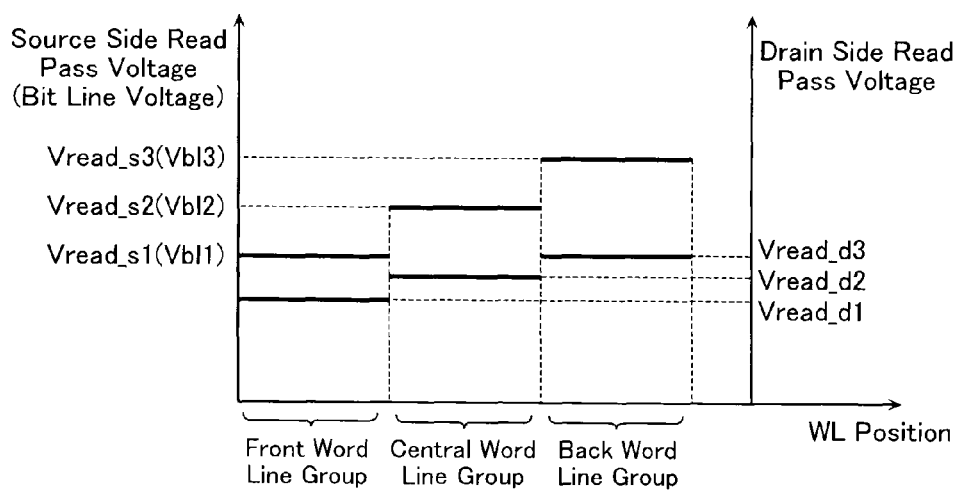
FIG. 14 is a view showing voltages during the write verify operation in the nonvolatile semiconductor memory device according to the seventh embodiment.

FIG. 14 is a view showing an operation in yet another example of the seventh embodiment. In the above-described embodiments, either one of the source side read pass voltage Vread_s and the drain side read pass voltage Vread_d was set to a fixed value. However, as shown in FIG. 14, it is also possible to change the source side read pass voltage to be source side read pass voltages Vread_s1, Vread_s2, and Vread_s3, and change the drain side read pass voltage to be drain side read pass voltages Vread_d1, Vread_d2, and Vread_d3. This too makes it possible to more finely control the write verify operation, thereby enabling a more precise write verify operation to be executed.

Eighth Embodiment

Next, an eighth embodiment of the present invention will be described with reference to FIG. 15. An overall configuration of a nonvolatile semiconductor memory device of the eighth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from those of the above-described embodiments in setting the bit line voltage and the read pass voltage to different values based on whether 1-bit data is held in the memory cell MC or whether multi-level data of 2 bits or more is held in the memory cell MC. The write verify operation in the nonvolatile semiconductor memory device according to the present embodiment will be described below with reference to FIG. 15.

[Write Verify Operation According to Eighth Embodiment]

Figure 15:
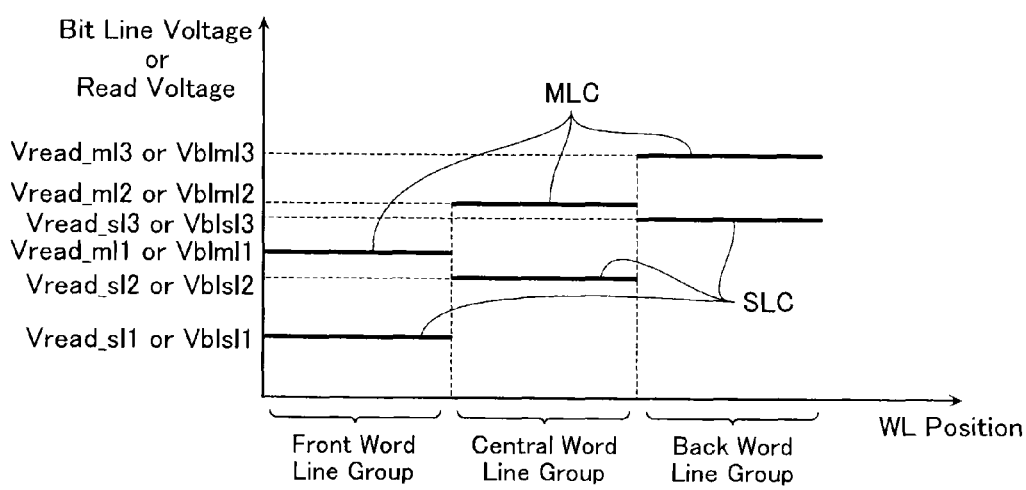
FIG. 15 is a view showing voltages during a write verify operation in a nonvolatile semiconductor memory device according to an eighth embodiment.

FIG. 15 is a view showing voltages during the write verify operation in the nonvolatile semiconductor memory device according to the eighth embodiment. As shown in the graph of voltages in FIG. 15, in the write verify operation in the nonvolatile semiconductor memory device according to the present embodiment, at least one of the bit line voltage and the read pass voltage is changed based on whether the memory cell MC is a single-level cell (SLC) that holds 1-bit data or a multi-level cell (MLC) that holds multi-level data of 2 bits or more.

In the case of a single-level cell, the value of the bit line voltage or the read pass voltage is changed to bit line voltages Vblsl1, Vblsl2, and Vblsl3 or to read pass voltages Vread_sl1, Vread_sl2, and Vread_sl3 based on which of the front word line group, the central word line group, and the back word line group the selected word line WL is positioned in. In the case of a multi-level cell, the value of the bit line voltage or the read pass voltage is changed to bit line voltages Vblml1, Vblml2, and Vblml3 or to read pass voltages Vread_ml1, Vread_ml2, and Vread_ml3 based on which of the front word line group, the central word line group, and the back word line group the selected word line WL is positioned in.

In the present embodiment, settings of the verify voltage Vcgv, the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage and the read pass voltage. As a result, variation in the threshold voltage distribution after write verify caused by fluctuation in the cell current Icell can be reduced. Note that a state of the memory cell MC sometimes differs based on data written in the memory cell MC. Therefore, respectively setting the bit line voltage and the read pass voltage to different values based on whether written data is binary or multi-level makes it possible to more finely control the write verify operation, thereby enabling a more precise write verify operation to be executed.

Ninth Embodiment

Next, a ninth embodiment of the present invention will be described with reference to FIGS. 16 and 17. An overall configuration of a nonvolatile semiconductor memory device of the ninth embodiment is similar to that of the first embodiment, hence a detailed description thereof will be omitted. Moreover, places having a similar configuration to in the first embodiment are assigned with identical reference symbols to those of the first embodiment, and a duplicated description of such places will be omitted. The write verify operation of the present embodiment differs from those of the above-described embodiments in that in the case where multi-level data of 2 bits or more is held, the bit line voltage and the read pass voltage are set to different values for the write verify operations on each of the data. The write verify operation in the nonvolatile semiconductor memory device according to the present embodiment will be described below with reference to FIGS. 16 and 17.

[Write Verify Operation According to Ninth Embodiment]

Figure 16:
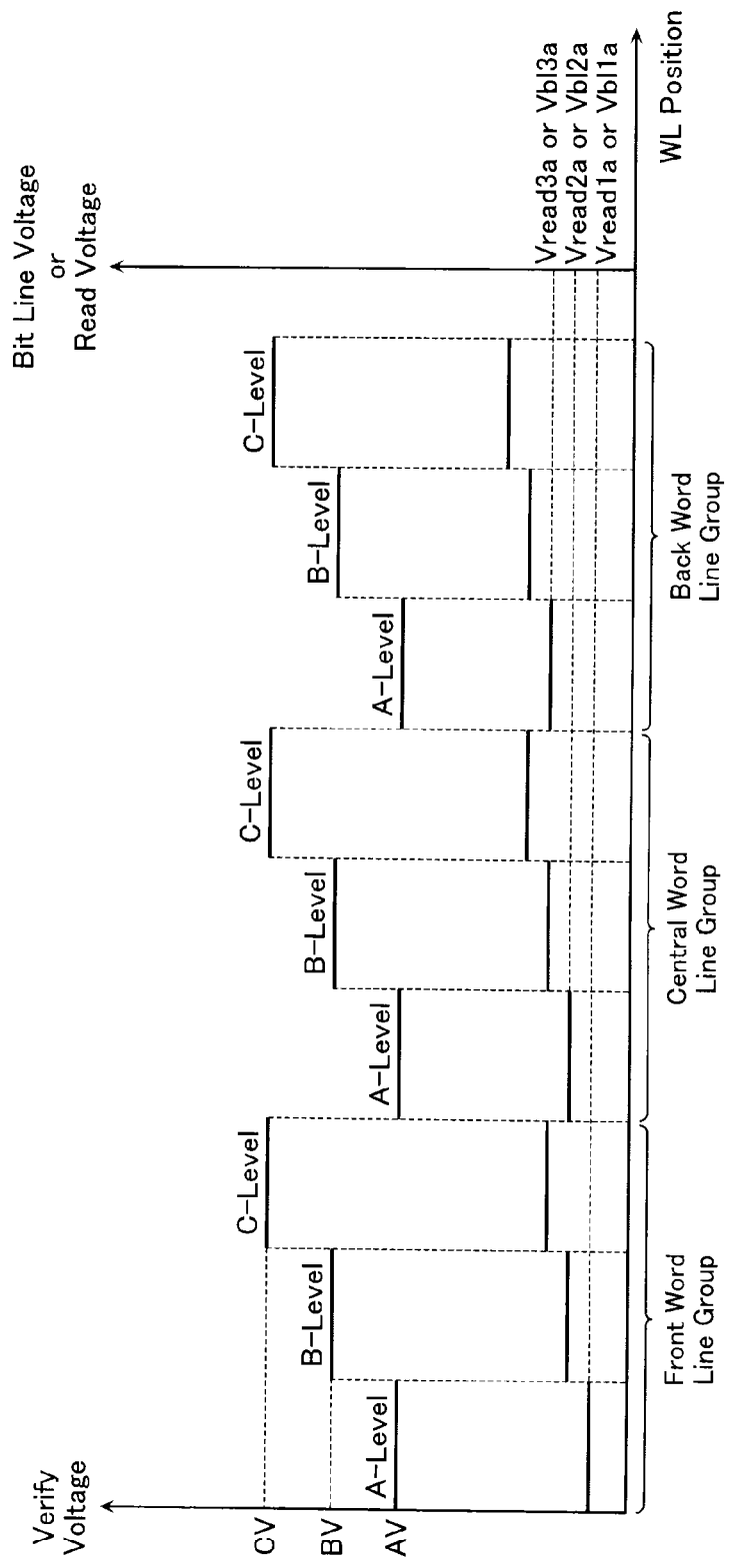
FIG. 16 is a view showing voltages during a write verify operation in a nonvolatile semiconductor memory device according to a ninth embodiment.

FIG. 16 is a view showing voltages during the write verify operation in the nonvolatile semiconductor memory device according to the ninth embodiment. The write verify operation in the nonvolatile semiconductor memory device according to the present embodiment will be described assuming that the memory cell MC holds 4-level data of 2 bits. As shown in the graph of voltages in FIG. 16, at least one of the bit line voltage and the read pass voltage is changed based on a state of written data as well as based on which of the front word line group, the central word line group, and the back word line group the selected word line WL is positioned in.

When writing the memory cell MC to a threshold voltage distribution of A-level, the value of the bit line voltage or the read pass voltage is changed to bit line voltages Vbl1a, Vbl2a, and Vbl3a, or read pass voltages Vread1a, Vread2a, and Vread3a based on which of the front word line group, the central word line group, and the back word line group the selected word line WL is positioned in. When writing the memory cell MC to threshold voltage distributions of B-level and C-level too, the values of the bit line voltage or the read pass voltage can be similarly changed.

Figure 17:
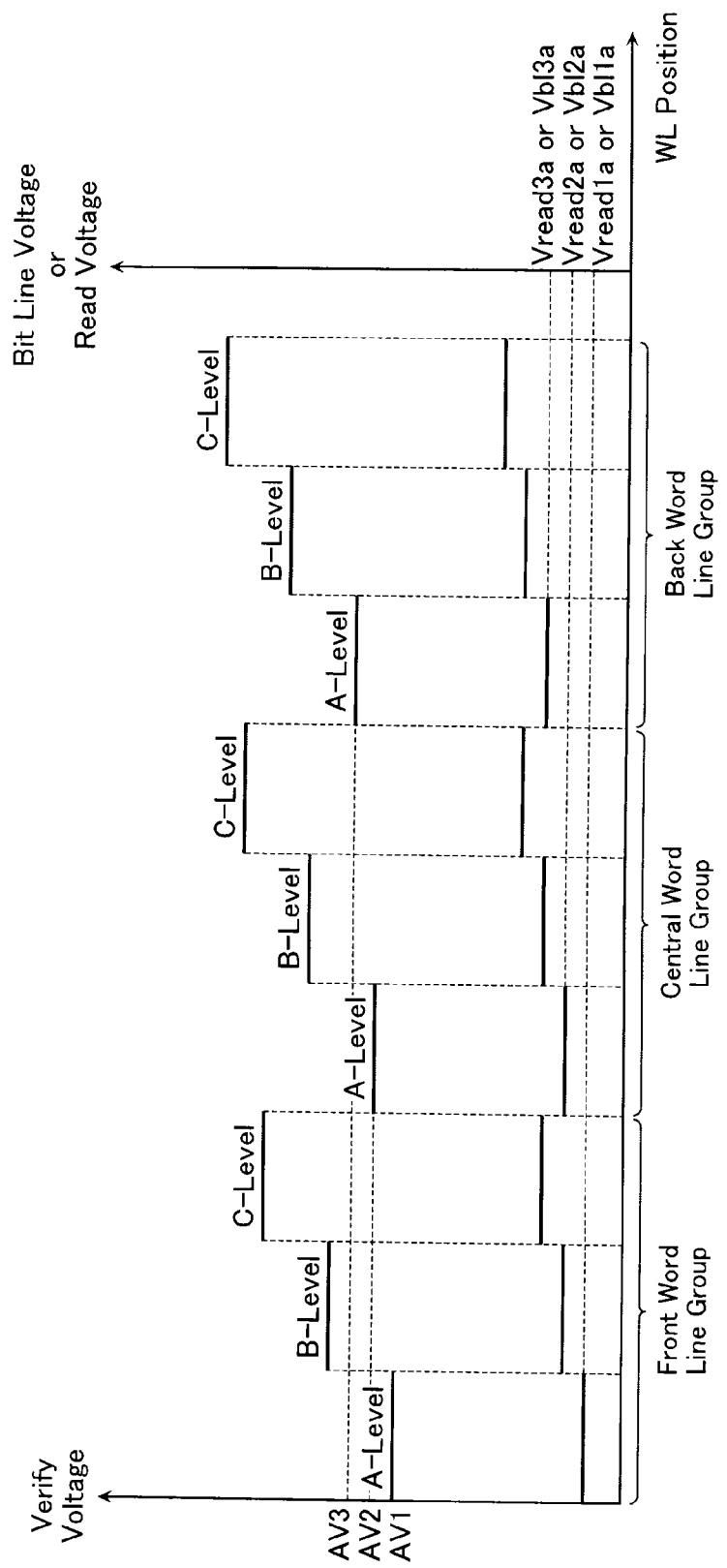
FIG. 17 is a view showing voltages during the write verify operation in the nonvolatile semiconductor memory device according to the ninth embodiment.

In addition, as shown in FIG. 17, when writing the memory cell MC to the threshold voltage distributions of A-level, B-level, and C-level, it is also possible to change the verify voltage based on which of the front word line group, the central word line group, and the back word line group the selected word line WL is positioned in. In FIG. 17, when writing the memory cell MC to the threshold voltage distribution of A-level, the verify voltage is changed to verify voltages AV1, AV2, and AV3. When writing the memory cell MC to the threshold voltage distributions of B-level and C-level too, the verify voltage can be similarly changed.

In the present embodiment, settings of the voltage Vsg applied to the select gate transistors SG0 and SG1, and so on, are similar to those in the write verify operation of the comparative example. This voltage application causes the write verify operation to the selected memory cell MC to be executed.

[Advantages]

In the write verify operation of the present embodiment too, a reduction of the cell current Icell caused by an increase in the write-completed memory cells MC can be compensated by changing the bit line voltage and the read pass voltage. As a result, variation in the threshold voltage distribution after write verify caused by fluctuation in the cell current Icell can be reduced. Moreover, respectively setting the bit line voltage and the read pass voltage during the write verify operation to different values based on data written in the memory cell MC makes it possible to more finely control the write verify operation, thereby enabling a more precise write verify operation to be executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, it is also possible to configure such that the number of times that the write operation and the erase operation have been performed on the memory cell MC is counted and held by the sequence control circuit 7 and that the voltage value of at least one of the bit line voltage and the read pass voltage can be changed based on the number of times that the write operation and the erase operation have been performed on the memory cell. In addition, it is also possible to change a value of the dummy read voltage Vread_dmy applied to the dummy word line DWL during the verify operation based on the position of the selected word line WL or the number of times that the write operation and the erase operation have been performed. Now, regarding change of the dummy read voltage Vread_dmy, it is not necessarily the case that the dummy read voltage Vread_dmy of the dummy word line DWL is changed following a change in the read pass voltage of an ordinary word line WL that is not a dummy word line DWL. Change of the dummy read voltage Vread_dmy is an arbitrary configurative element capable of being further combined with a change in the read pass voltage of an ordinary word line WL that is not a dummy word line DWL.

What is claimed is:

1. A nonvolatile semiconductor memory device, comprising:
    a memory cell array configured to have NAND strings arranged therein, each of the NAND strings including:
        a memory string configured to have a plurality of memory cells connected in series therein; and a first select transistor and a second select transistor respectively connected to two ends of the memory string;
    a plurality of word lines respectively connected to control gate electrodes of the plurality of memory cells;
    a plurality of bit lines each connected to a first end of the memory string included in the NAND strings via the first select transistor;
    a source line connected to a second end of the memory string via the second select transistor; and
    a control circuit configured to apply a verify voltage to a selected word line, apply a read pass voltage that renders conductive an unselected memory cell regardless of cell data to an unselected word line, and apply a bit line voltage of a certain value to a selected bit line, to execute a write verify operation that determines whether a selected memory cell has a desired threshold voltage or not, the selected memory cell being included in one of the NAND strings that includes one of the memory cells before undergoing execution of a write operation,
    the control circuit being configured to change a voltage value of the bit line voltage based on a position of the selected word line among the plurality of word lines relative to the NAND string during the write verify operation, and
    the control circuit being configured to apply different values of the read pass voltage for an unselected word line connected to the memory cell where the write operation has been performed and an unselected word line connected to the memory cell where the write operation has not been performed.

2. A nonvolatile semiconductor memory device comprising:
    a memory cell array configured to have NAND strings arranged therein, each of the NAND strings including:
        a memory string configured to have a plurality of memory cells connected in series therein, and a first select transistor and a second select transistor respectively connected to two ends of the memory string;
    a plurality of word lines respectively connected to control gate electrodes of the plurality of memory cells;
    a plurality of bit lines each connected to a first end of the memory string included in the NAND strings via the first select transistor;
    a source line connected to a second end of the memory string via the second select transistor; and
    a control circuit configured to apply a verify voltage to a selected word line, apply a read pass voltage that renders conductive an unselected memory cell regardless of cell data to an unselected word line, and apply a bit line voltage of a certain value to a selected bit line, to execute a write verify operation that determines whether a selected memory cell has a desired threshold voltage or not,
    the control circuit being configured to
        change a voltage value of the bit line voltage based on a position of the selected word line among the plurality of word lines relative to the NAND string during the write verify operation,
        execute a write operation to a memory cell connected to a second one of the word lines after executing a write operation to a memory cell connected to a first one of the word lines in the NAND string, and
        change a voltage value of the read pass voltage based on the position of the selected word line among the plurality of word lines relative to the NAND string,
    wherein the read pass voltage when the second word line is the selected word line being higher than the read pass voltage when the first word line is the selected word line.

3. The nonvolatile semiconductor memory device according to claim 1, wherein
    the plurality of word lines are divided into a plurality of ranges based on a respective word line position relative to the NAND string, and
    the control circuit is configured to set the bit line voltage such that when the selected word line is included in an identical range, the bit line voltage attains an identical voltage value, and when the selected word line is included in a different range, the bit line voltage attains a mutually different voltage value.

4. The nonvolatile semiconductor memory device according to claim 3, wherein
    the control circuit is configured to:
    execute the write operation to a memory cell connected to a second one of the word lines after executing a write operation to a memory cell connected to a first one of the word lines in the NAND string; and
    set the read pass voltage such that when the selected word line is included in an identical range, the read pass voltage attains an identical voltage value, and when the selected word line is included in a different range, the read pass voltage attains a mutually different voltage value,
    wherein the read pass voltage when the second word line is the selected word line is higher than the read pass voltage when the first word line is the selected word line.

5. The nonvolatile semiconductor memory device according to claim 3, wherein
    the control circuit is configured to:
    execute the write operation to a memory cell connected to a second one of the word lines after executing a write operation to a memory cell connected to a first one of the word lines in the NAND string; and change a voltage value of the read pass voltage based on a position of the selected word line within the range, wherein the read pass voltage when the second word line is the selected word line is higher than the read pass voltage when the first word line is the selected word line.

6. The nonvolatile semiconductor memory device according to claim 3, wherein the control circuit is configured to change a voltage value of the verify voltage based on a position of the selected word line within the range.

7. The nonvolatile semiconductor memory device according to claim 1, wherein the control circuit is configured to change the voltage value of the bit line voltage respectively every selected word line.

8. The nonvolatile semiconductor memory device according to claim 7, wherein the control circuit is configured to:
execute the write operation to a memory cell connected to a second one of the word lines after executing a write operation to a memory cell connected to a first one of the word lines in the NAND string; and
change the voltage value of the read pass voltage respectively every selected word line,
wherein the read pass voltage when the second word line is the selected word line is higher than the read pass voltage when the first word line is the selected word line.

9. The nonvolatile semiconductor memory device according to claim 1, wherein the control circuit is configured to execute the write operation such that data is written sequentially from the memory cell on a side of the source line in the NAND string, and, when the selected word line is in a range which is closer to the source line than a certain position of the NAND string, set the bit line voltage to an identical voltage value, and, when the selected word line is in a range which is closer to the bit line than the certain position of the NAND string, change the voltage value of the bit line voltage.

10. The nonvolatile semiconductor memory device according to claim 1, wherein the control circuit is configured to change a voltage value of the verify voltage based on the position of the selected word line among the plurality of word lines relative to the NAND string.

11. The nonvolatile semiconductor memory device according to claim 1, wherein the control circuit is configured to change a voltage value of at least one of the bit line voltage and the read pass voltage based on the number of times that the write operation and the erase operation have been performed on the memory cell.

12. The nonvolatile semiconductor memory device according to claim 2, wherein the plurality of word lines are divided into a plurality of ranges based on a respective word line position relative to the NAND string, and the control circuit is configured to set the read pass voltage such that when the selected word line is included in an identical range, the read pass voltage attains an identical voltage value, and when the selected word line is included in a different range, the read pass voltage attains a mutually different voltage value, and the control circuit is configured to change the voltage value of the bit line voltage based on a position of the selected word line within the range.

13. The nonvolatile semiconductor memory device according to claim 10, wherein the plurality of word lines are divided into a plurality of ranges based on a respective word line position relative to the NAND string, and the control circuit is configured to set the verify voltage such that when the selected word line is included in an identical range, the verify voltage attains an identical voltage value, and when the selected word line is included in a different range, the verify voltage attains a mutually different voltage value, and the control circuit is configured to change the voltage value of the bit line voltage based on a position of the selected word line within the range.

14. The nonvolatile semiconductor memory device according to claim 1, wherein the memory cell is configured to hold multiple bits of data allocated to a plurality of threshold voltage distributions, and the control circuit is configured to change a voltage value of at least one of the bit line voltage and the read pass voltage based on data written in the memory cell.

15. A nonvolatile semiconductor memory device, comprising:

a memory cell array configured to have NAND strings arranged therein, each of the NAND strings including: a memory string configured to have a plurality of memory cells connected in series therein; and a first select transistor and a second select transistor respectively connected to two ends of the memory string;

a plurality of word lines respectively connected to control gate electrodes of the plurality of memory cells;

a plurality of bit lines each connected to a first end of the memory string included in the NAND strings via the first select transistor;

a source line connected to a second end of the memory string via the second select transistor; and a control circuit configured to apply a verify voltage to a selected word line, apply a read pass voltage that renders conductive an unselected memory cell regardless of cell data to an unselected word line, and apply a bit line voltage of a certain value to a selected bit line, to execute a write verify operation that determines whether a selected memory cell has a desired threshold voltage or not, the control circuit being configured to
execute a write operation to a memory cell connected to a second one of the word lines after executing a write operation to a memory cell connected to a first one of the word lines in the NAND string; and
change a voltage value of the read pass voltage based on a position of the selected word line among the plurality of word lines relative to the NAND string during the write verify operation,
wherein the read pass voltage when the second word line is the selected word line is higher than the read pass voltage when the first word line is the selected word line.

16. The nonvolatile semiconductor memory device according to claim 15, wherein the plurality of word lines are divided into a plurality of ranges based on a respective word line position relative to the NAND string, a range including the second word line is different from a range including the first word line, and the control circuit is configured to set the read pass voltage such that when the selected word line is included in an identical range, the read pass voltage attains an identical voltage value, and when the selected word line is included in a different range, the read pass voltage attains a mutually different voltage value.

17. The nonvolatile semiconductor memory device according to claim 15, wherein the control circuit is configured to change the voltage value of the read pass voltage respectively every selected word line.

18. The nonvolatile semiconductor memory device according to claim 15, wherein the control circuit is configured to execute a write operation such that data is written sequentially from the memory cell on a side of the source line in the NAND string, and, when the selected word line is in a range which is closer to the source line than a certain position of the NAND string, set the read pass voltage to an identical voltage value, and, when the selected word line is in a range which is closer to the bit line than the certain position of the NAND string, change the voltage value of the read pass voltage.

19. The nonvolatile semiconductor memory device according to claim 15, wherein the control circuit is configured to apply a first read pass voltage to a first unselected word line and to apply a second read pass voltage to a second unselected word line, the first unselected word line being positioned more to a side of the source line than the selected word line and being connected to the memory cell where a write operation has already finished, and the second unselected word line being positioned more to a side of the bit line than the selected word line and being connected to the memory cell where the write operation has not yet been performed, and the control circuit is configured to change a voltage value of at least the first read pass voltage.

20. The nonvolatile semiconductor memory device according to claim 15, wherein the control circuit is configured to change a voltage value of the verify voltage based on the position of the selected word line among the plurality of word lines relative to the NAND string.

* * * * *